United States Patent
Podoleanu et al.

(10) Patent No.: US 10,211,594 B2
(45) Date of Patent: Feb. 19, 2019

(54) AKINETIC SWEPT LASER APPARATUS AND METHOD FOR FAST SWEEPING OF THE SAME

(71) Applicant: University of Kent, Kent (GB)

(72) Inventors: Adrian Podoleanu, Kent (GB); Radu-Florin Stancu, Kent (GB)

(73) Assignee: UNIVERSITY OF KENT, Kent (GB)

(*) Notice: Subject to any disclaimer, the term of this patent is extended or adjusted under 35 U.S.C. 154(b) by 0 days.

(21) Appl. No.: 14/882,885

(22) Filed: Oct. 14, 2015

(65) Prior Publication Data
US 2016/0226215 A1 Aug. 4, 2016

(30) Foreign Application Priority Data
Jan. 29, 2015 (GB) .................................. 1501502.7

(51) Int. Cl.
| | | |
|---|---|---|
| H01S 3/11 | (2006.01) |
| H01S 3/10 | (2006.01) |
| H01S 3/067 | (2006.01) |
| H01S 5/065 | (2006.01) |
| H01S 5/14 | (2006.01) |
| H01S 3/08 | (2006.01) |

(52) U.S. Cl.
CPC ........ *H01S 3/1109* (2013.01); *H01S 3/06791* (2013.01); *H01S 3/10007* (2013.01); *H01S 5/0657* (2013.01); *H01S 5/146* (2013.01); *H01S 3/08009* (2013.01); *H01S 3/08013* (2013.01)

(58) Field of Classification Search
CPC .. H01S 3/1109; H01S 3/08013; H01S 5/0657; H01S 3/1121
See application file for complete search history.

(56) References Cited

U.S. PATENT DOCUMENTS

| | | | |
|---|---|---|---|
| 6,538,748 B1 | 3/2003 | Tucker et al. | |
| 7,489,713 B2 | 2/2009 | Chong et al. | |
| 8,275,008 B2 | 9/2012 | Ko et al. | |
| 8,605,768 B2 | 12/2013 | Furusawa et al. | |
| 2011/0155916 A1* | 6/2011 | Furusawa | H01S 3/06791 250/363.04 |
| 2012/0188554 A1* | 7/2012 | Inoue | H01S 3/08013 356/479 |
| 2013/0329757 A1* | 12/2013 | Huber | H01S 3/06791 372/18 |

OTHER PUBLICATIONS

R. H. Huber et al, "Fourier domain mode-locking (FDML): A new laser operating regime and applications for optical coherence tomography", Optics Express 14(8), 3225-3237 (Apr. 17, 2006).
S. Yamashita, M.Asano, "Wide and fast wavelength-tunable mode-locked fiber laser based on dispersion tuning", Optics Express 14(20), 9399-9306 (Oct. 2, 2006).

(Continued)

*Primary Examiner* — Tod T Van Roy
(74) *Attorney, Agent, or Firm* — Leason Ellis LLP

(57) ABSTRACT

A detuned resonant mechanism is employed in a laser cavity to modulate in frequency the mode-locking mechanism to achieve high frequency tuning rates, exceeding MHz. The configuration of the laser is compatible with working at sweeping rates close to multiples of the cavity resonance frequency as well as with buffering for increased tuning speeds.

2 Claims, 28 Drawing Sheets

(56) References Cited

OTHER PUBLICATIONS

Y. Takubo, S.Yamashita, "High-speed dispersion-tuned wavelength-swept fiber laser using a reflective SOA and a chirped FBG", Optics Express vol. 21, No. 4, 5130-5139, Feb. 25, 2013.
R. Stancu et. al, "Versatile Swept Source With Adjustable Coherence Length", IEEE Photonics Technology Letters, vol. 26, Issue 16, 1629-1632, Aug. 15, 2014.

* cited by examiner

AKINETIC SWEPT LASER APPARATUS AND METHOD FOR FAST SWEEPING OF THE SAME

CROSS-REFERENCE TO RELATED APPLICATIONS

The present application claims priority under 35 U.S.C. § 119 to British Patent Application No. 1501502.7, filed Jan. 29, 2015, which is hereby incorporated by reference in its entirety.

FIELD OF THE INVENTION

The present invention relates to a tunable laser and to a driving method of the same laser.

BACKGROUND AND PRIOR ART

The method mostly accepted today for optical coherence tomography (OCT) is based on sweeping the frequency of a narrow band laser, usually termed as a swept source. Several principles of sweeping the laser emission have been developed. The most common principle employed is that of a spectral filter in a closed loop, where the tunable laser apparatus uses a Fabry-Perot filter, as disclosed in Patent Document 1 (U.S. Pat. No. 6,538,748 B1), a polygon filter, as disclosed in Patent Document 2 (U.S. Pat. No. 7,489,713 B2), or a micro electrical mechanical scanning (MEMS) filter, as disclosed in Patent Document 3 (U.S. Pat. No. 8,275,008 B2). Commercial vendors exist, such as Axsun and Santec, companies using MEMS filters. Such filters limit the tuning to several hundreds of kHz. In Non-Patent Document 1 (R. H. Huber et al, "Fourier domain mode-locking (FDML): A new laser operating regime and applications for optical coherence tomography", Optics Express 14(8), 3225-3237 (2006)), a large tuning frequency has been reported using Fabry-Perot filters and principles of Fourier domain mode-locking (FDML) that allowed sweeping rates exceeding several MHz. However, the reliability of Fabry-Perot and the complexity of buffering limit the applicability of such principles. The filters mentioned above are based on mechanical movement of parts which limits their reliability. Therefore, there is an interest in akinetic laser sources that achieve tuning with no mechanical movement of parts. On the other hand, in modern applications of OCT there is an increasing demand in three dimensional imaging at high speed, with increased axial range.

An akinetic solution, based on the principle of dispersion tuning, is illustrated in the Non-Patent Document 2 (S. Yamashita, M. Asano, "Wide and fast wavelength-tunable mode-locked fiber laser based on dispersion tuning", Optics Express 14(20), 9399-9306 (2006)). This method has limited tunability, due to the significant decrease in output power when driving it at high frequency repetition rates.

In Patent Document 5 (U.S. Pat. No. 8,605,768 B2), a solution to the previous problem is presented, which includes a positive dispersion region, a negative dispersion region and two modulators in a ring resonator, assembly which brings the amount of wavelength dispersion to approximately zero. This solution relies though only on externally driven modulation units, like acousto-optic or electro-optic modulators, for example.

In Non-Patent Document 3 (Y. Takubo, S. Yamashita, "High-speed dispersion-tuned wavelength-swept fiber laser using a reflective SOA and a chirped FBG", Optics Express Vol. 21, No. 4, 5130-5139 (2013)), a wavelength swept fiber laser apparatus using a chirped fiber Bragg grating as dispersive medium is presented. Although the tuning wavelength range obtained is broad, the OCT imaging speed achieved was only up to 250 kHz, which is below the values demanded by modern swept source OCT applications.

In Non-Patent Document 4 (R. Stancu et. al, "Versatile Swept Source With Adjustable Coherence Length", IEEE Photonics Technology Letters, Vol. 26, Issue 16, 1629-1632 (2014)), it is shown how the laser linewidth can be varied by driving the SOA in a dispersive laser cavity at different mode-locking frequencies. The sweeping frequency could not exceed a few tens of kHz.

Therefore, there is an interest in developing akinetic swept lasers that can address the disadvantages of the solutions presented above, first in providing much larger tuning speeds.

To make distinction between our invention and prior art, it is essential to note that the akinetic solutions presented above present the following characteristics. There are multiple values of the RF carriers that can be used, and the RF signal is tuned around such carrier values, differing by the inverse of the roundtrip. Around each such RF carrier, there is a tuning bandwidth and solutions presented above consist in tuning the RF signal within a single such band.

In the present invention, the RF tuning is practised over many such bands. More specifically, two resonant modulation effects are applied. A first modulation that induces mode-locking is imposed by driving the optical gain medium at a high radio frequency value. A second modulation is applied, inspired from the practice of Fourier domain mode-locking applied to Fabry-Perot lasers, where sweeping is performed at a rate close to the inverse roundtrip of the wave in the cavity. In opposition to the prior art where the sweeping has to be performed at the exact inverse of the roundtrip, the method disclosed here essentially uses a detuning of the excitation from the inverse of the roundtrip. Let us refer from now on to the inverse of the roundtrip as to the resonance frequency in the cavity, $f_R$.

Essential for the operation of the akinetic laser according to the invention are two characteristics: (i) the frequency of the signal, $f_m$, applied to mode-lock the laser is a large multiple N of $f_R$ and is deviated over a large tuning band, covering as many as b multiples of $f_R$ and (ii) the rate at which $f_S$ is tuned (the second modulation) is slightly detuned from the multiple M of the resonant frequency $f_R$, where M is a small number, 1, 2, . . . 10. Due to the large deviation of $f_S$, the characteristic (i), makes the invention different from the technology presented in the Non-Patent Document 2 (S. Yamashita, M. Asano), in the Non-Patent Document 3 (Y. Takubo, S. Yamashita) and in the Non-patent documents 4 (R. Stancu, David A. Jackson, Adrian Podoleanu) mentioned above. The characteristic (ii), due to the slight detuning from $Mf_R$, makes the invention different from the technology protected by Patent Document 1 (U.S. Pat. No. 6,538,748 B1), Patent Document 2 (U.S. Pat. No. 7,489,713 B2), and Patent Document 3 (U.S. Pat. No. 8,275,008 B2). By doing so, the driving method described in this invention can improve the scanning speed of an akinetic laser apparatus based on a dispersive cavity from hundreds of kHz to over several MHz.

SUMMARY OF THE INVENTION

In a first aspect, the present invention discloses a method and apparatuses to implement an akinetic swept source that can operate at a much faster sweeping speed, with considerable higher power output.

In a second aspect, the invention discloses a laser apparatus based on a ring resonator, which includes an optical gain amplifier and a dispersive mean.

In a third aspect, the invention discloses a laser apparatus based on an in-line resonator, which includes an optical gain amplifier and a dispersive mean.

In a fourth aspect, a driving method for the apparatus is disclosed, that can determine a fast tunable narrowband laser emission, tuned at multiple M of the resonant frequency, $f_R$.

Further characteristics of the present invention will be detailed from the following exemplary embodiments described, supported by attached drawings.

BRIEF DESCRIPTION OF DRAWINGS

The novel features which are believed to be characteristic of the present invention, as to its structure, organization, use and method of operation, together with further objectives and advantages thereof, will be better understood from the following drawings in which preferred embodiments of the invention will be illustrated by ways of example. It is expressly understood, however, that the drawings are for the purpose of illustration and description only and are not intended as a definition of the limits of the invention. Embodiments of this invention will now be described in association with the accompanying drawings in which.

DETAILED DESCRIPTION OF PREFERRED EMBODIMENTS

Figure 1A:
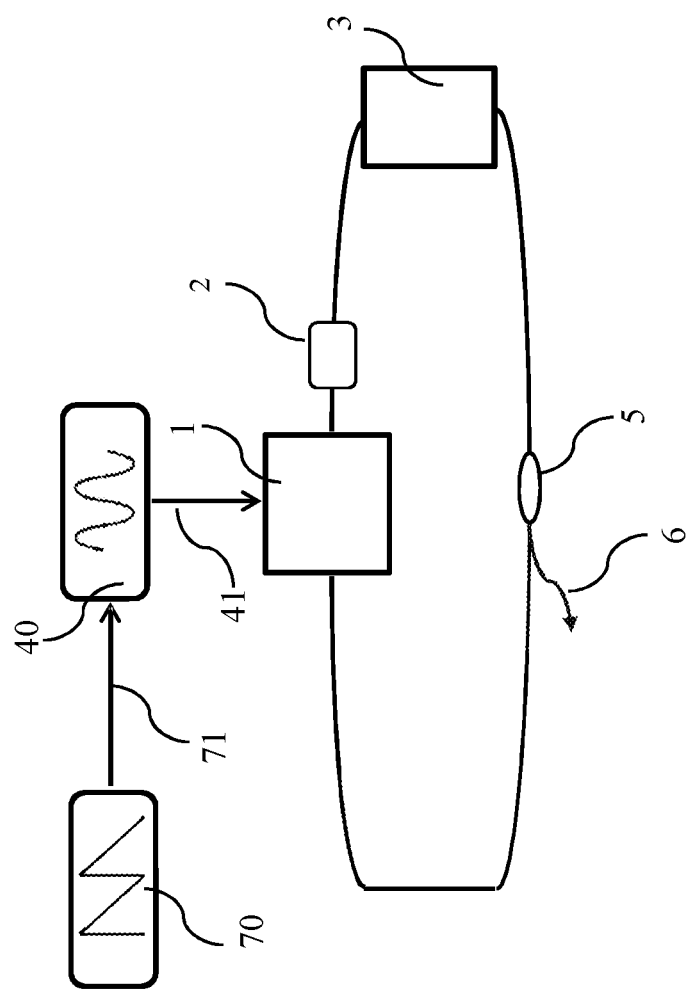
FIG. 1a shows, in diagrammatic form, the main elements of a swept laser embodiment according to prior art.

In continuation, embodiments of the present invention will be detailed. Various features of the present invention, as well as other objects and advantages, are set forth in the following description and the accompanying drawings in which the same reference numerals depict the same or similar elements.

Figure 1B:
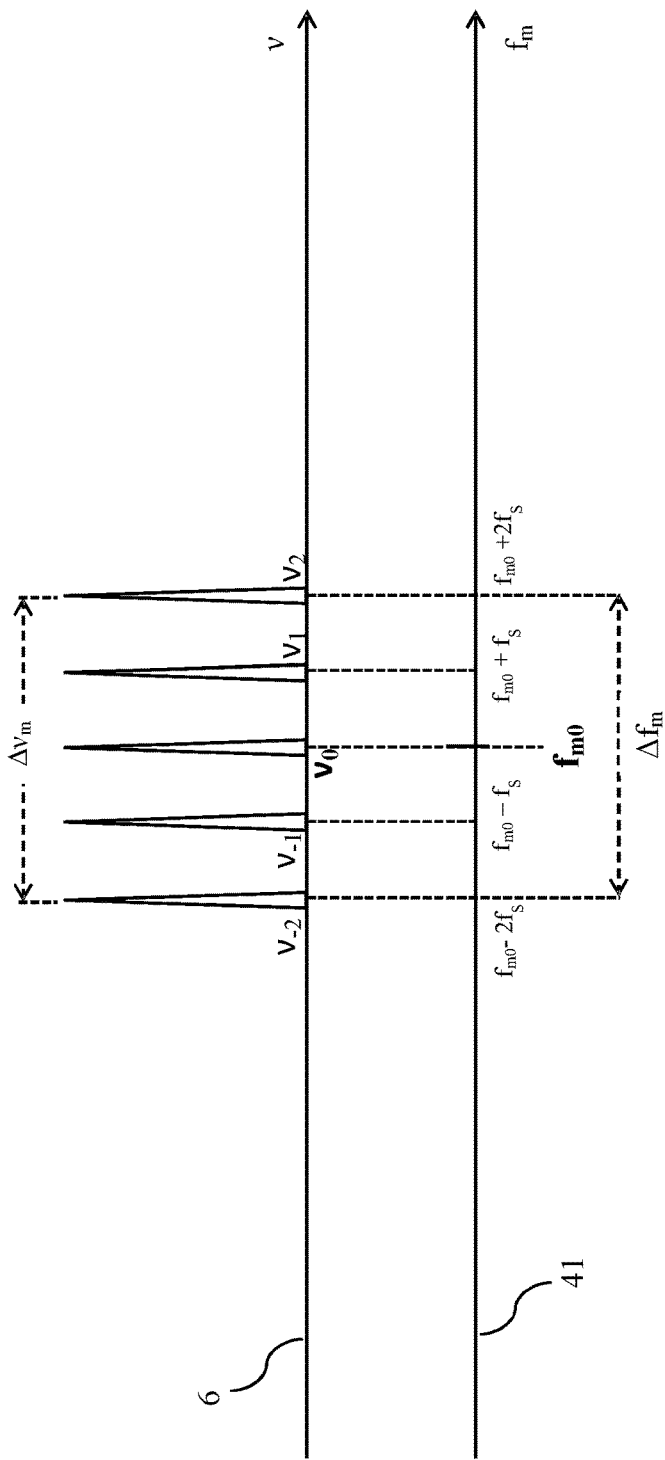
FIG. 1b shows the spectrum of a dispersive cavity mode-locked laser, according to prior art, where the optical frequency, v, is tuned by sweeping the RF frequency $f_m$ within an RF bandwidth $\Delta f_m$, at a sweeping rate $f_S$.

FIG. 1a illustrates, in diagrammatic form, the main elements of an akinetic swept laser apparatus according to prior art, which includes a be modulated mode-locking mechanism block 1, an optical gain amplifier 2, dispersive means 3, a driving radio frequency generator 40, swept in frequency (or a voltage controlled oscillator), and a splitter 5 to divert some of the light to an output 6. The optical gain amplifier can be implemented using a doped fibre, such as Ytterbium doped fibre for emission around 1 micron for example. In this case, as locking mechanism, an electro-optic modulator is used as block 1. When the gain amplifier is equipped with a semiconductor optical amplifier (SOA), this can play the role of both blocks 1 and 2, where the SOA is modulated using a radio frequency (RF) signal, 41, synthetized by a generator 40. When the period of the RF signal is equal to submultiples of the round trip in the loop, mode-locking takes place. This implements the $1^{st}$ locking (resonance) mechanism. Experimentally it is known from the practice of dispersive lasers that the frequency, $f_m$, of the RF signal 41 used to determine mode-locking, can be any from a set of RF frequencies. These frequencies can be grouped within bands around frequency carriers, where the carriers are multiples of $f_R$. Due to the dispersion means 3 in the cavity, a different RF frequency determines a different optical frequency, as shown in FIG. 1b. The generator 40 could be a voltage controlled oscillator (VCO), whose input signal 71 is delivered by a generator, 70. Typical for prior art is that the signal 71 is sufficiently of small amplitude to sweep the frequency of the generator 40 within a single locking band. Another characteristic for the prior art is the small frequency deviation of the frequency of the signal 41 delivered by the generator 40.

FIG. 1*b* illustrates the RF range of the signal $f_m$, applied to the mode-locking mechanism block 1 and the optical frequency, v, generated within the RF range. As an example, 5 values for the RF are shown, distanced in practice by the value of the sweeping frequency, $f_S$=1 kHz. For each such RF value $f_m$, of the signal 41, a different optical frequency is generated. The 5 steps of $f_s$, lead to RF frequencies of $f_{m0}-2f_s$, $f_{m0}-f_s$, $f_{m0}$, $f_{m0}+f_s$, $f_{m0}+2f_s$ that determine 5 optical frequencies, $v_{-2}$, $v_{-1}$, $v_0$, $v_1$, $v_2$. The optical frequency is a large number multiple of the $f_R$ that determines the number of modes in the cavity: $v_o = C_m f_{m0}$. This means that for $f_{m0}+f_s$, $v_1$ is different from $v_o$ by $C_m f_s$. If statically, slowly, the RF frequency is deviated within a bandwidth $\delta f_m$, then the optical frequency varies within an optical frequency $\Delta v = C_m \delta f_m$.

Such a regime has been reported in the Non-Patent Document 2 (S. Yamashita, M. Asano), in Non-Patent Document 3 (Y. Takubo, S. Yamashita) and in Non-patent document 4 (R. Stancu et al). The selection of optical frequency, determined by the value of RF according to FIG. 2, can take place in any of the mode-locking bands. In FIG. 1*b*, a single mode-locking band is shown, as used by the prior art and determined by the generators 40 and 70. Generator 40 may generate a few mV to tens of mV while the frequency of the signal 70 is deviated in a single band, so it is smaller than $f_R$. This corresponds to a particular number of modes in the laser cavity, determined by the ratio of the round trip time to the period of the RF signal, i.e. $C_m$. Mode-locking can also be obtained in neighbouring bands, centered on other $f_m$ values, which differ from $f_{m0}$ by $f_R$ or by multiples of the $f_R$.

Due to dispersion, the index of refraction in the laser cavity depends on the optical frequency and therefore, $f_R$ is different for different optical frequencies. By changing the frequency of the signal modulating the gain in the cavity, the optical frequency can be swept. The resonance frequency of the ring laser cavity is defined as:

$$f_R = \frac{c}{nL}, \quad (1)$$

where c represents the speed of light in vacuum, n is the refractive index of the cavity and L is the laser cavity length. The chromatic dispersion in the cavity can be defined for n as a function of wavelength λ or optical frequency v. When a frequency $f_m$ modulates the gain in a dispersive cavity, a $1^{st}$ mode-locking mechanism is induced at the inverse of the roundtrip of light in the cavity. The wavelength tuning range $\Delta \lambda$ is expressed as:

$$\Delta \lambda = -\frac{n_0}{cDf_{m0}} \Delta f_m, \quad (2)$$

where $f_{m0}$ is the central mode-locking frequency, $n_0$ is the refractive index at the central optical frequency emitted, D is the dispersion parameter of the ring, and $\Delta f_m$ represents the change in the modulation frequency. Maximum tuning range, $\Delta \lambda_{max}$, limited by the frequency spectral range (FSR), is given by:

$$\Delta \lambda_{max} = \frac{1}{|D|Lf_{m0}} \quad (3)$$

The equations above are known by those skilful in art of mode-locking dispersive cavities.

Novel and interesting behaviour is achieved by driving the locking mechanism 1 with signal 41 deviated in frequency over several locking bands, engaging in this way frequencies from different locking bands, according to the invention, as exemplified in the following figures.

Figure 2:
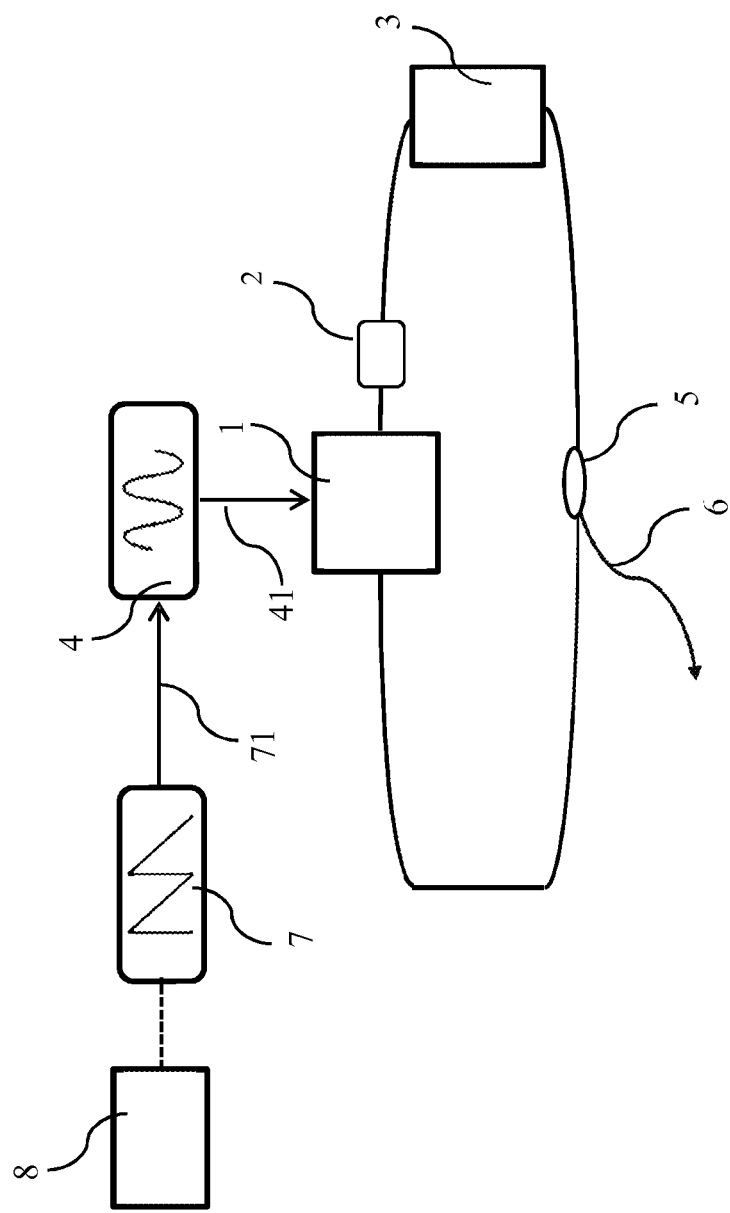
FIG. 2 shows, in diagrammatic form, the main elements of a swept laser embodiment according to the invention.

FIG. 2 illustrates in diagrammatic form, the main elements of an akinetic swept laser embodiment according to the invention.

Figure 10:
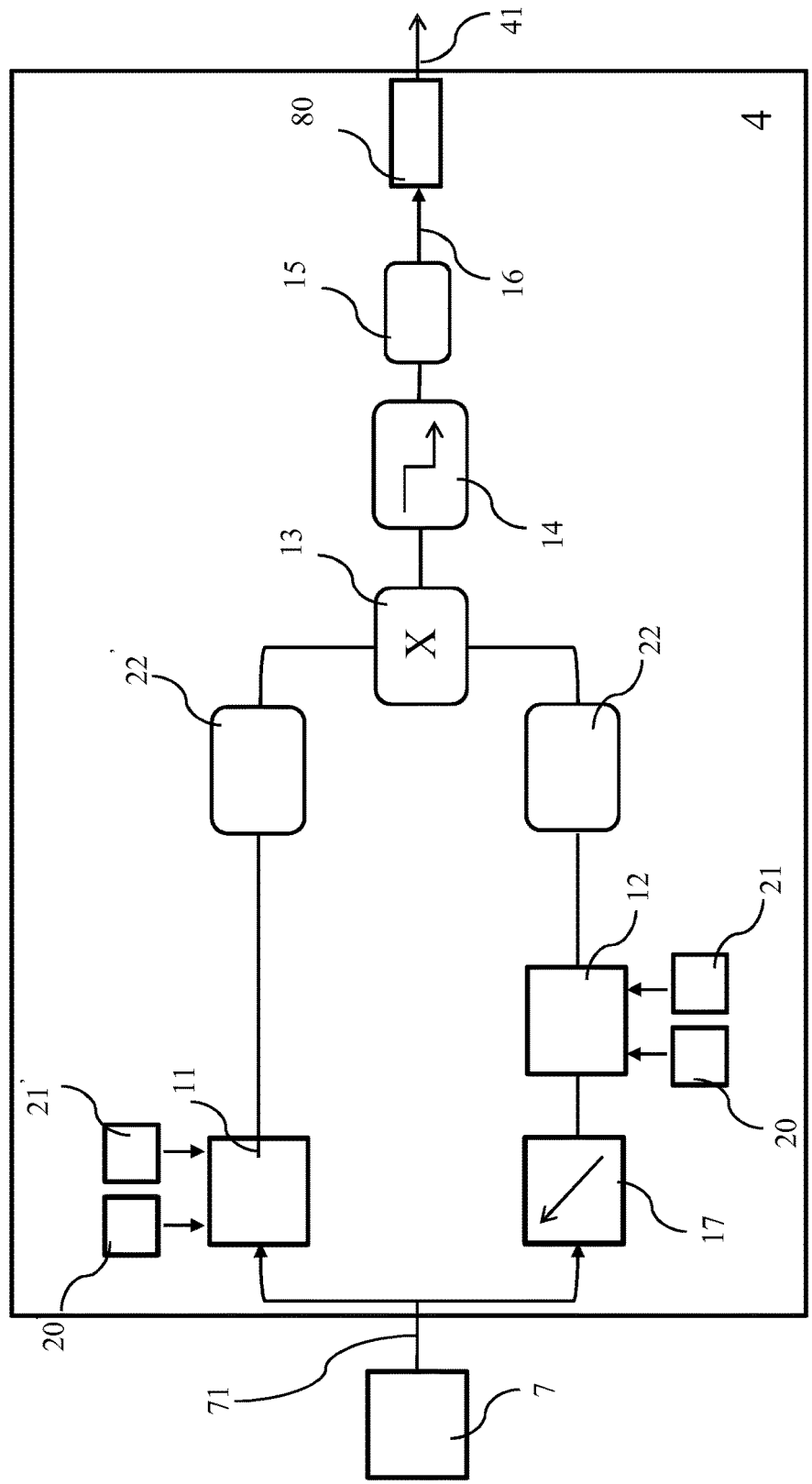
FIG. 10 shows the schematic diagram of a large tuning bandwidth RF generator.
Figure 11:
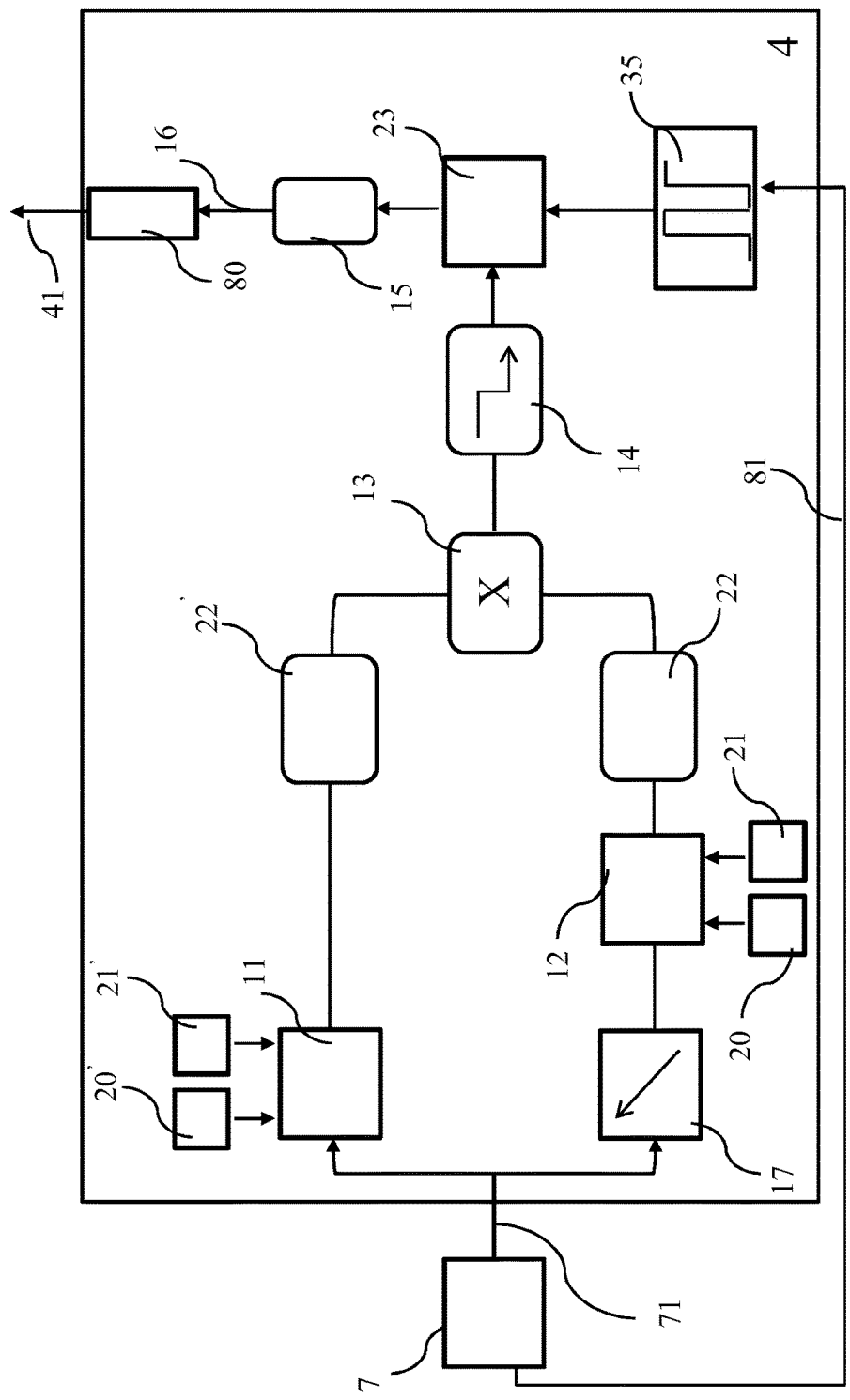
FIG. 11 shows the schematic diagram of a synchronised switch to enhance the stability of the optical signal generated.

The large frequency deviation VCO 4, generates a signal 41 to mode-locking mechanism block 1, that can be deviated in its frequency $\Delta f_m$, over a much larger bandwidths than in the prior art, over many multiple values, b, of the $f_R$. The coefficient b determines the number of resolved points in the spectrum. Therefore, specialised high frequency VCOs are required by the invention, that can generate GHz signals with deviations over tens and even hundreds of MHz. The large frequency deviation VCO 4 replaces the small frequency deviation VCO 40. Embodiments for such specialised VCOs are illustrated in FIGS. 10 and 11.

As another difference from the prior art, the signal 71 delivered by the large voltage sweeping generator, 7, needs to cover larger voltage swings than those delivered by the small voltage sweeping generator 70, in order to drive the large frequency deviation VCO 4.

As yet another difference, the frequency $f_S$ of the signal 71 is detuned by δf, from multiple values, M, of the resonance frequency, $f_R$. The driving of the VCO 4 by the signal 71 at a frequency close to $Mf_R$ represents the $2^{nd}$ locking (resonance) mechanism typical for the invention (but at a frequency $f_S$ that differs from $Mf_R$).

In order to accomplish such functionality, a controller 8 is used to drive the sweeping generator 7. The controller is instructed by three parameters: $f_R$, δf and b.

The larger the voltage applied to the sweeping generator 7, as controlled by the controller 8, the larger the deviation in frequency, $\Delta f_m$, of the VCO 4 and this determines the number of resolved spectral points $b = \Delta f_m / f_R$. The controller also determines how large is the deviation δf of the frequency $f_S$ of the signal generated by the sweeping generator 7, from the resonance frequency, $f_R$. The larger the detuning δf, the wider is the tuning bandwidth, Δv. The third parameter input to the controller 8, the resonance frequency $f_R$ is measured according to modalities known in the art. This can be evaluated by modulating the mode-locking mechanism block, 1, with sinusoidal signal of variable frequency, the minimum frequency where a maximum is registered is the frequency $f_R$. Alternatively, by using a large gain amplifier for the signal photodetected from the laser that is reapplied for positive feedback to the mode-locking mechanism, the laser starts pulsating at $f_R$. It is supposed from now on in the disclosure that one of these two modalities are used to determine the frequency $f_R$ which is then used as input for the controller 8.

The laser output optical tuning bandwidth Δλ is given by:

$$\Delta \lambda = \frac{\Delta f_m}{f_R} \cdot C_m \cdot \delta f \cdot \delta \lambda \quad (4)$$

where $C_m$ is a cavity coefficient and $\Delta f_m$ represents the frequency tuning range of the VCO 4.

Figure 3:
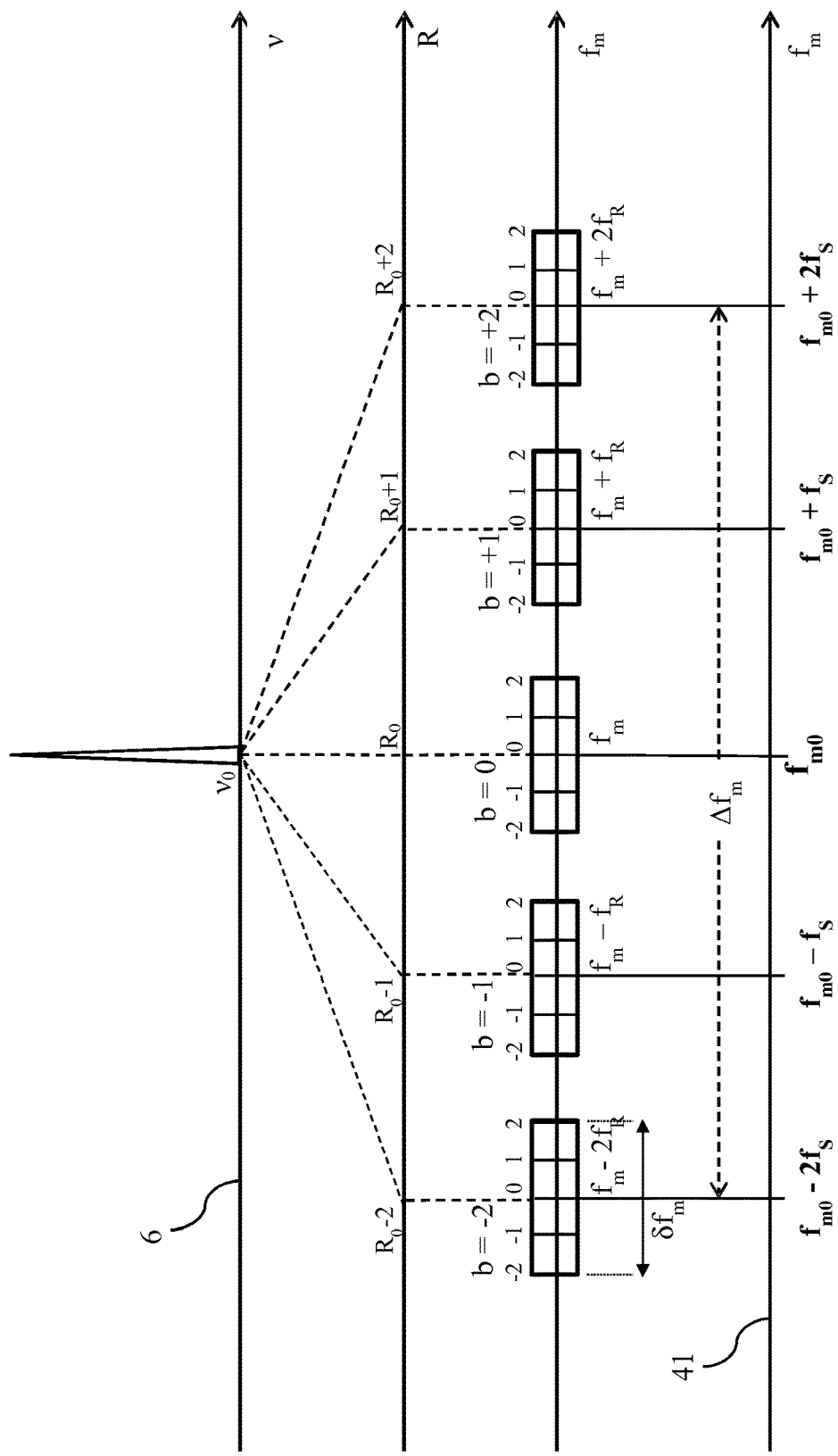
FIG. 3 shows a particular scenario of the $2^{nd}$ resonance mechanism according to invention, where the optical frequency is unique and narrow band.

FIG. 3 illustrates a situation, where, according to the invention, the RF frequency of the signal 41 is stepped from an RF mode-locking band to the next.

There is a number of optical modes in the cavity defined by $v_0/f_R=m_0$.

Mode-locking is induced by driving the mode-locking mechanism block 1 with signal 41 pulsating at $f_{m0}$. There is a number of RF modes, R, in the same cavity, where $f_{m0}/f_R=R_0$.

Each tuning band is characterised by the same number of optical modes but by a different number of RF modes in the cavity, R. If $f_m$ is stepped in steps of $f_S=f_R$, then for the next higher $f_m$ frequency, the number of RF modes increased by 1 to $R_0+1$, where $(f_{m0}+f_R)/f_R=R_0+1$.

In this particular case, on each band, the RF frequency of the driving signal is exactly in the middle of each band, exactly fitting an integer multiple, R, of $f_R$ and therefore determining the same optical frequency, $v_0$. The same optical frequency of the optical signal generated results, irrespective of the RF frequency of the driving signal, modified in steps of the resonance frequency $f_R$. At each new step, although a signal of a different radio frequency is sent to the mode-locking mechanism block 1, the same optical frequency, $v_0$ is generated. For the novel method disclosed here, it is important to note that monochromatic optical emission is obtained, if the mode-locking mechanism block 1 is driven at $f_{m0}$, signal which is swept at a frequency $f_S=f_R$. This is because when an oscillator at $f_{m0}$ is swept at $f_S$, its spectrum consists in a comb of discrete frequencies distanced by the sweeping frequency, $f_S$. If $f_S=f_R$, then despite the fact that $f_m$ is swept over a large bandwidth $\Delta f_m=f_{m,max}-f_{m,min}$, irrespective of the sweeping band, each characterised by a different R, the optical emission is monochromatic, as shown at the top of FIG. 3. In other words, FIG. 3 refers to both static and dynamic scenarios:

(i): static, unique RF signal is sequentially applied to the mode-locking mechanism block 1, and the same $v_0$ optical frequency is obtained, where sequentially, the frequency of signal 41 is stepped by $f_R$, as shown in FIG. 3, by applying a signal of either frequency $f_{m0}-2f_S$, $f_{m0}-f_S$, $f_{m0}$, $f_{m0}+f_S$, $f_{m0}+2f_S$ when $f_S=f_R$ and so on and (ii): dynamic, $f_{m0}$ is swept at a rate $f_S=f_R$. As the bands where mode-locking takes place are separated by $f_R$, the number of bands covered by frequency sweeping $f_m$ can be approximately estimated as $B=\Delta f_m/f_R$. Irrespective of the number B of bands, the laser emits the frequency $v_0$ only. The case (ii) also implies that the RF $f_m$ is tuned within a bandwidth $\Delta f_m$ that exceeds the extension of individual locking bands, $\delta f_m$. This represents a first distinctive characteristic of the method presented in the invention, according to which the RF is swept at much larger deviations than the RF bandwidth for each band, $\delta f_m$.

Figure 4:
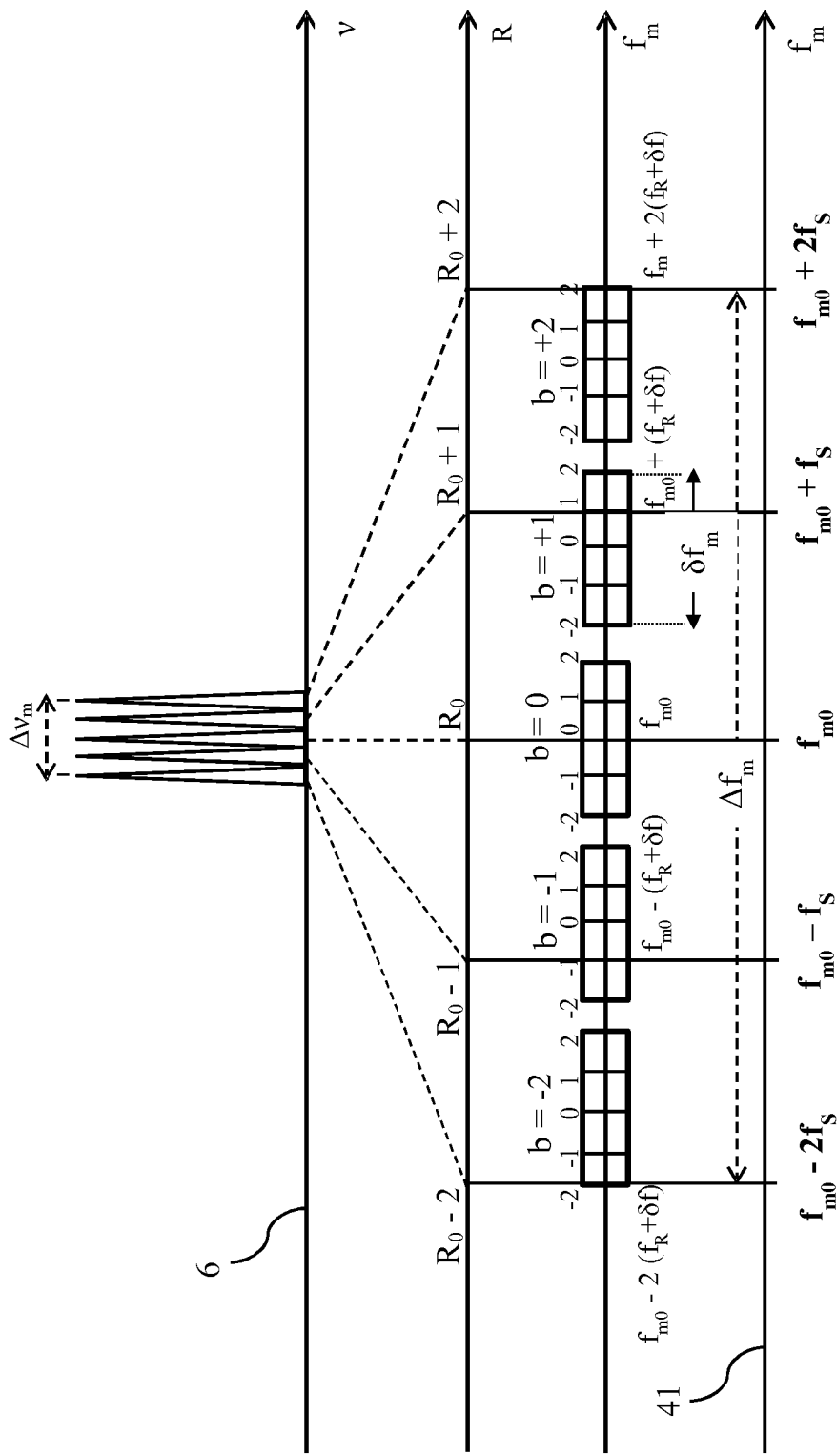
FIG. 4 shows the spectrum of the swept laser according to the invention, where detuning from resonance is applied to the $2^{nd}$ resonance mechanism and optical tuning takes place.

FIG. 4 shows the method of optical tuning according to the invention, where from one band to the next, the RF frequency is shifted in detuned steps from $f_R$. This is the second characteristic (ii) of the method according to the invention. In this way, the RF in each mode-locking band determines a different optical frequency. Let us say that $f_S=f_R\pm b\delta f$, where b is the order of the band measured starting from an arbitrary band, corresponding to the central RF value, $f_{m0}$. In FIG. 3, b=−2, −1, 0, 1, 2. For b=1, the frequency of the RF signal applied to the mode-locking mechanism block 1 is slightly different from the $f_{m0}+f_R$ by $\delta f$, and therefore the optical frequency is different from $v_o$ by $C_m\delta f$, where the coefficient $C_m=v_o/f_{m0}$. For b=2, the RF applied is different from the $f_{m0}+f_R$ by 2$\delta f$. Therefore the optical frequency is different from $v_0$ by $2C_m\delta f$ and so on, i.e. by $bC_m\delta f=b(v_o/f_{m0})\delta f$.

So the RF jumps by $f_R+b\delta f$ and the optical frequency jumps by $b(v_o/f_{m0})\delta f$ from $v_o$. By doing so, in the spirit of the invention, a small deviation in the sweeping speed from resonance, $\delta f$, is multiplied by a large number, b, to implement a large tuning optical bandwidth, $\Delta v_m$. In other words, if the detuning $\delta f$ reaches the RF deviation of the locking band, measured statically, $\delta f_m$, then the same tuning bandwidth $\Delta v_m$ would be achieved for b=1. However this is not achievable in practice, as the dynamic tuning band is less than the static tuning bandy. By tuning over b locking bands, S resolvable points in the tuning spectrum, $\Delta v_m$ are achieved.

When tuning at a rate $f_S$, the number of resolved points is $\delta f_m/f_S$.

Let us say that we use the conventional 1$^{st}$ locking mechanism only. If $f_S$ is much smaller than $\delta f_m$, for instance $f_S$=10 Hz and $\delta f_m$=10 kHz, then there are sufficient spectral points in the tuned spectrum, 1000. If however $f_S$ reaches the resonance frequency $f_R$, due to the fact that $\delta f_m<f_R$, $\delta f_m/f_S$ becomes less than 1, therefore the only way to secure a sufficient number of points in the spectrum is by jumping over several locking bands, b, that leads to the spirit of this invention.

As above, two scenarios are possible:

Static, case (i), where a signal with an RF frequency as shown in FIG. 4 is applied uniquely, and where an optical frequency, different from $v_0$, is achieved, by stepping $f_S$ in steps of $f_{m0}+f_R+\delta f$.

Equally, the same set of optical frequencies is obtainable by sweeping the frequency to induce mode-locking at $f_S$ rate, case (ii). In this case, a detuned rate from resonance is used, with $f_S=f_R+\delta f$.

EXAMPLES

In continuation, examples of the present invention will be described.

First Example

Figure 5:
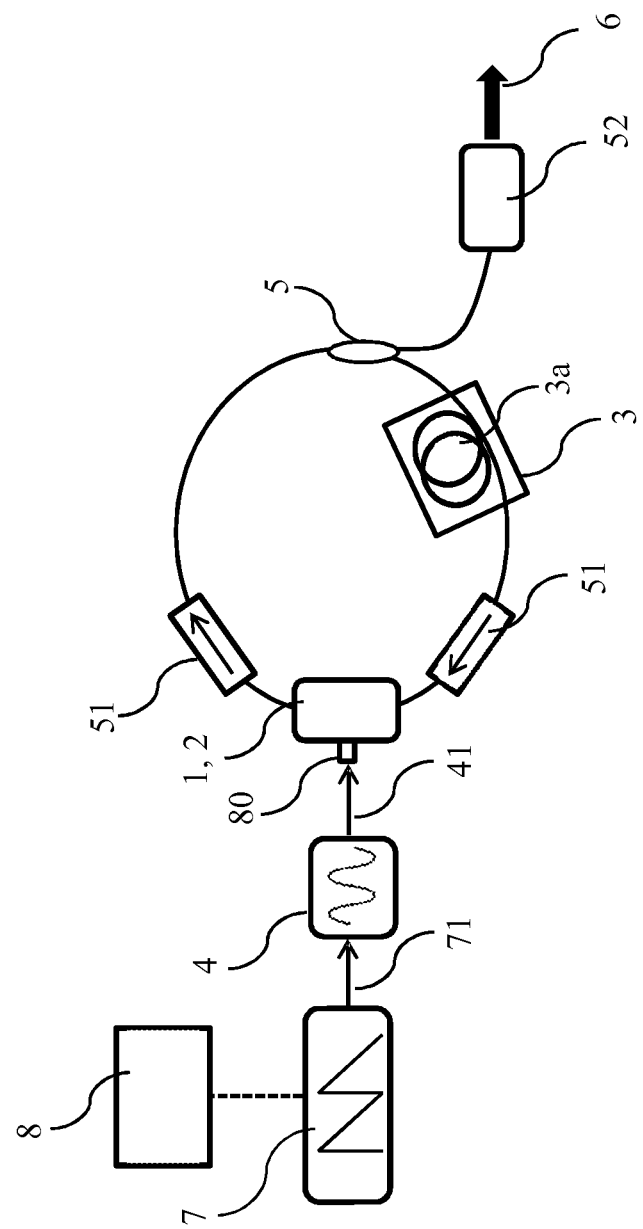
FIG. 5 shows a generic embodiment of the invention using a ring laser configuration.

FIG. 5 illustrates the embodiment of an akinetic swept laser according to the third aspect of the invention. A fibre ring laser configuration is employed, where the functions of both mode-locking mechanism block (nonlinear medium) 1 and optical amplifier 2 are accomplished by a semiconductor optical amplifier (SOA), 1, 2 according to the present invention. The SOA 1, 2 is placed in a ring delimited by fiber optic isolators (optional) 51, which ensure unidirectional lasing, together with dispersion means 3 implemented using a dispersion compensating fiber (DCF), 3a. The RF signal 41 is applied to the SOA 1, 2 via a radio frequency input 80 (bias tee). The output optical emission is drawn out through splitter 5, a single mode coupler of 10/90, with 10% extracted out of the cavity. The semiconductor optical amplifier 52 is of similar type of device as the gain medium 1, 2, but of larger dBm power value.

As a practical implementation, a SOA, 1, 2, type SOA-L-C-14-FCA, BT CIP 1 that operates at 1550 nm, maximum current 600 mA and 3 dB bandwidth larger than 50 nm is used. As 3a, a DCF with a dispersion parameter $D_{DCF}$=−140 ps/nm/km at 1550 nm is used. The DCF provides chromatic dispersion in the laser cavity needed for dispersion tuning and the 1$^{st}$ resonance mechanism. The combination of the negative dispersion due to the DCF of length $L_{DCF}$=200 m with the positive dispersion $D_{SMF}$=15 ps/nm/km at 1550 nm, due to the single mode fibre of length $L_{SMF}$=10 m, determines a net negative dispersion of: $L_{DCF}D_{DCF}$+ $L_{SMF}D_{SMF}$=−30 ps/nm.

Figure 6:
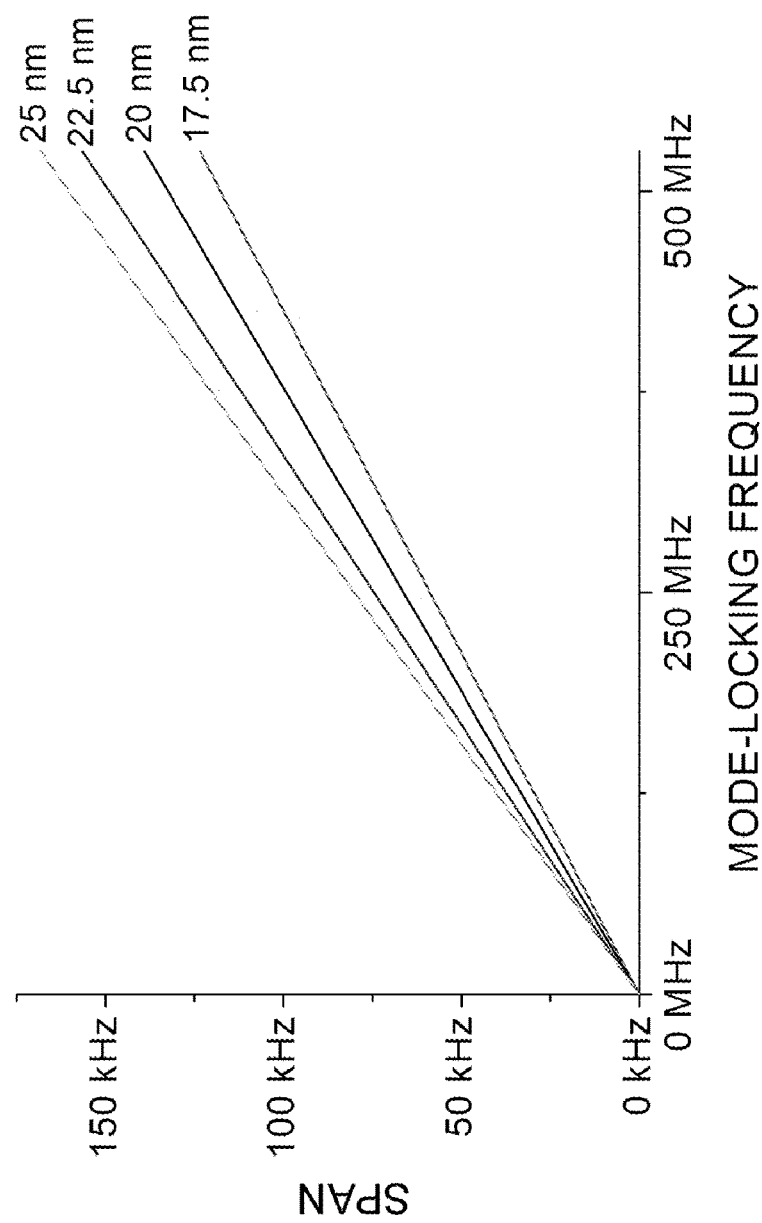
FIG. 6 shows results of an experimental set-up, according to FIG. 1, for the necessary mode-locking bandwidth that needs to be applied for mode-locking values up to 500 MHz.

FIG. 6 illustrates the required mode-locking bandwidth $\Delta f_m$ within which the frequency $f_m$ of the signal 41, up to 500 MHz, needs to be shifted in order to achieve 17.5 nm, 20 nm, 22.5 nm and, respectively, 25 nm, for the swept laser operating in the 1$^{st}$ mode-locking regime (as illustrated in FIG. 1b), at $f_m$=400 MHz and $\Delta f_m$=250 kHz.

Figure 7:
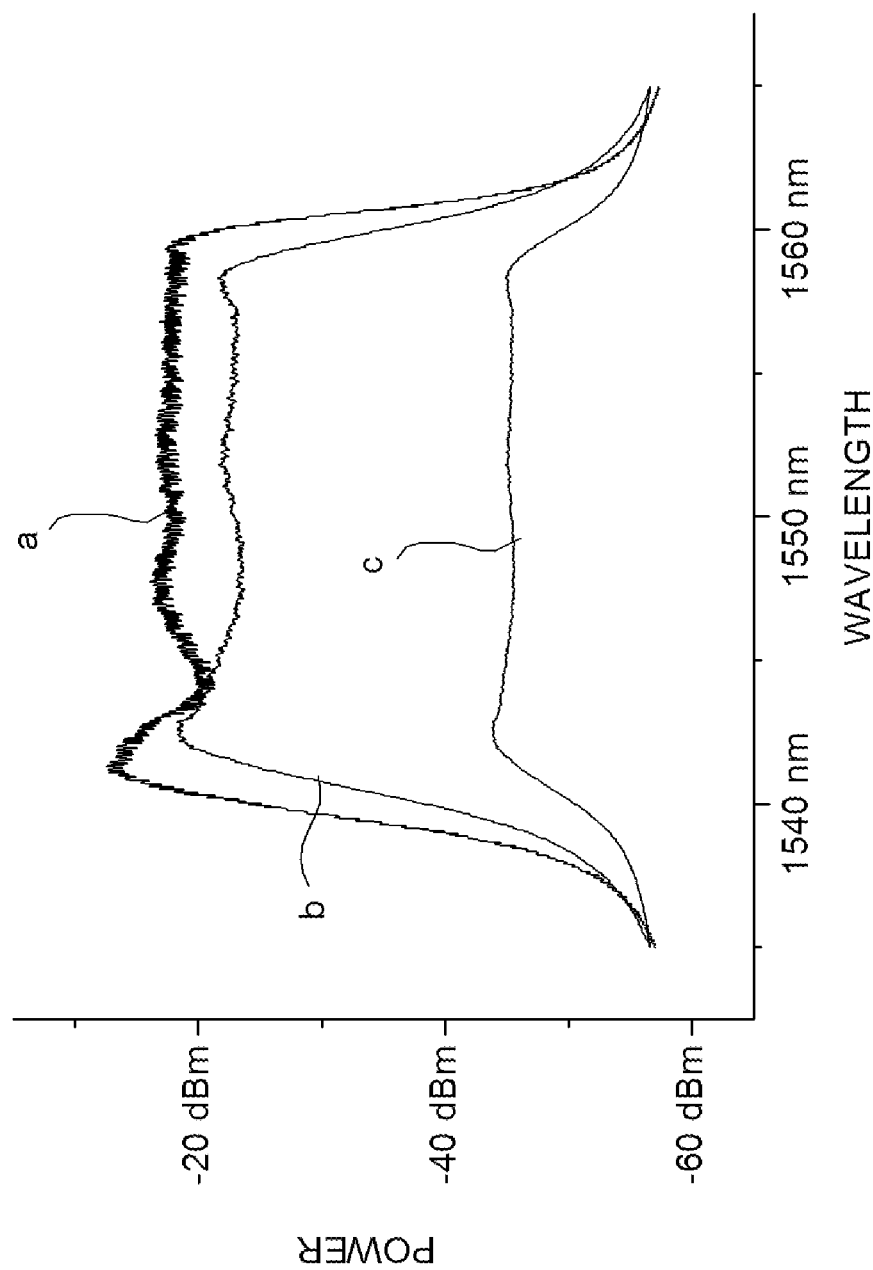
FIG. 7 shows the spectrum emitted by the embodiment in FIG. 5 employing the two resonance mechanisms.

FIG. 7 shows the spectra 7a, 7b and 7c emitted by the embodiment in FIG. 5, working as in the prior art (on the principle depicted in FIG. 1b), at a low frequency rate $f_R$ of 1 kHz (7a), 2 kHz (7b) and, respectively 10 kHz (7c), using generators 40 and 70.

By using a variable frequency RF signal generator instead of 7, the cavity resonance frequency, $f_R$ is found as 800 kHz. This corresponds to the inverse of the round trip in the ring, i.e.:

L/(c/n)=1/$f_R$=1/(800 kHz), so using c=3·10$^8$ m/s and n=1.5, L=250 m, where L represents the total optical path length in the cavity.

A controller 8 is used to drive the sweeping generator 7 and it is instructed by three parameters: $f_R$, $\delta f$ and b.

Then as a large frequency deviation voltage controlled oscillator 4, a VCO (Mini-Circuits type ZX-368-S+) in series with a power amplifier (Mini-Circuits, ZFL-2500VH+) are used. This can allow an extremely wide frequency deviation, $\Delta f_m$=60 MHz (in a range from $f_{m,min}$=360 MHz for 0 V to $f_{m,max}$=420 MHz) for a voltage variation at its input of 10 V. A large voltage sweeping generator 7, which delivers a saw-tooth sweeping signal 71 of 5V amplitude and 2.5 V bias is used to drive the frequency deviation of the large frequency deviation VCO 4.

Figure 8A:
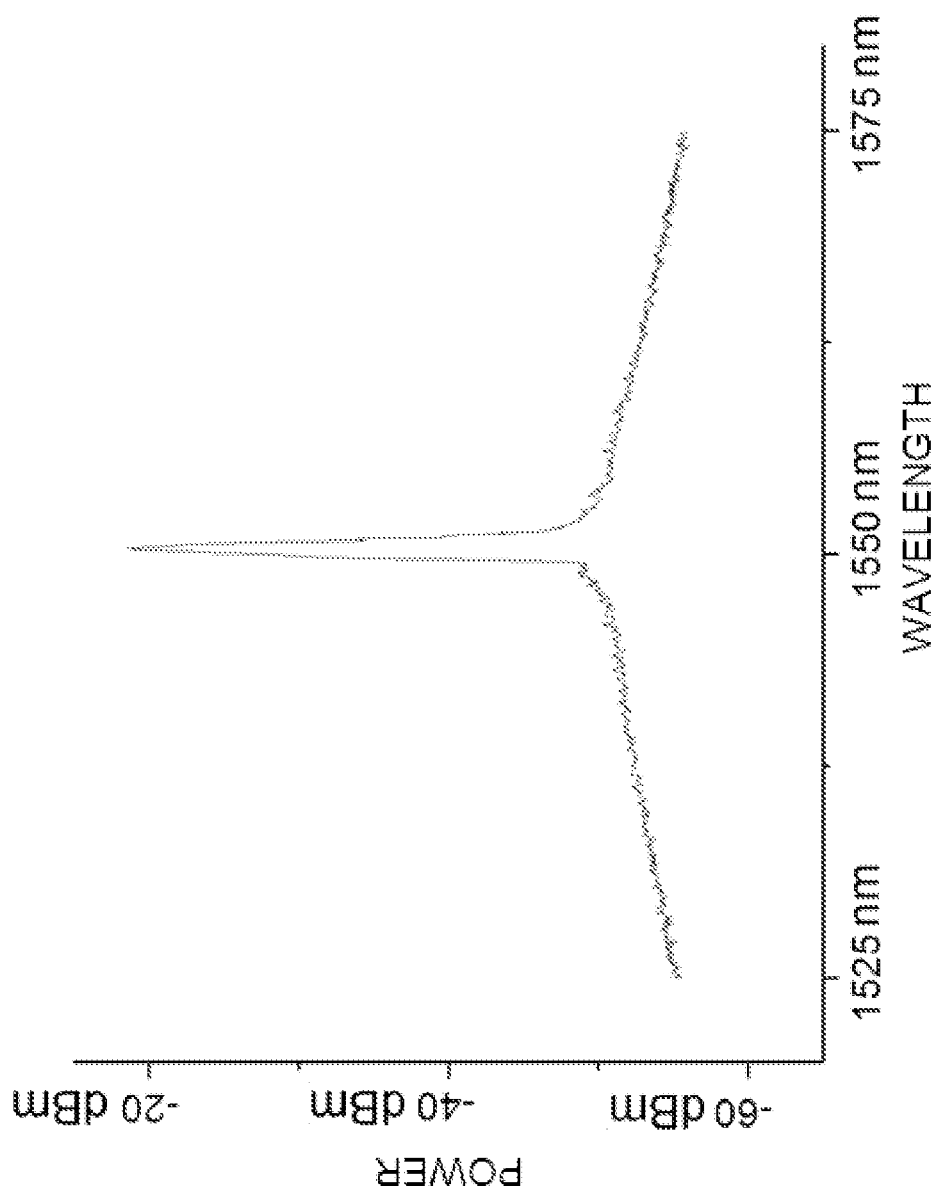
FIG. 8a shows the optical spectrum of the embodiment in FIG. 5 when operated according to the principle illustrated in FIG. 3.
Figure 8B:
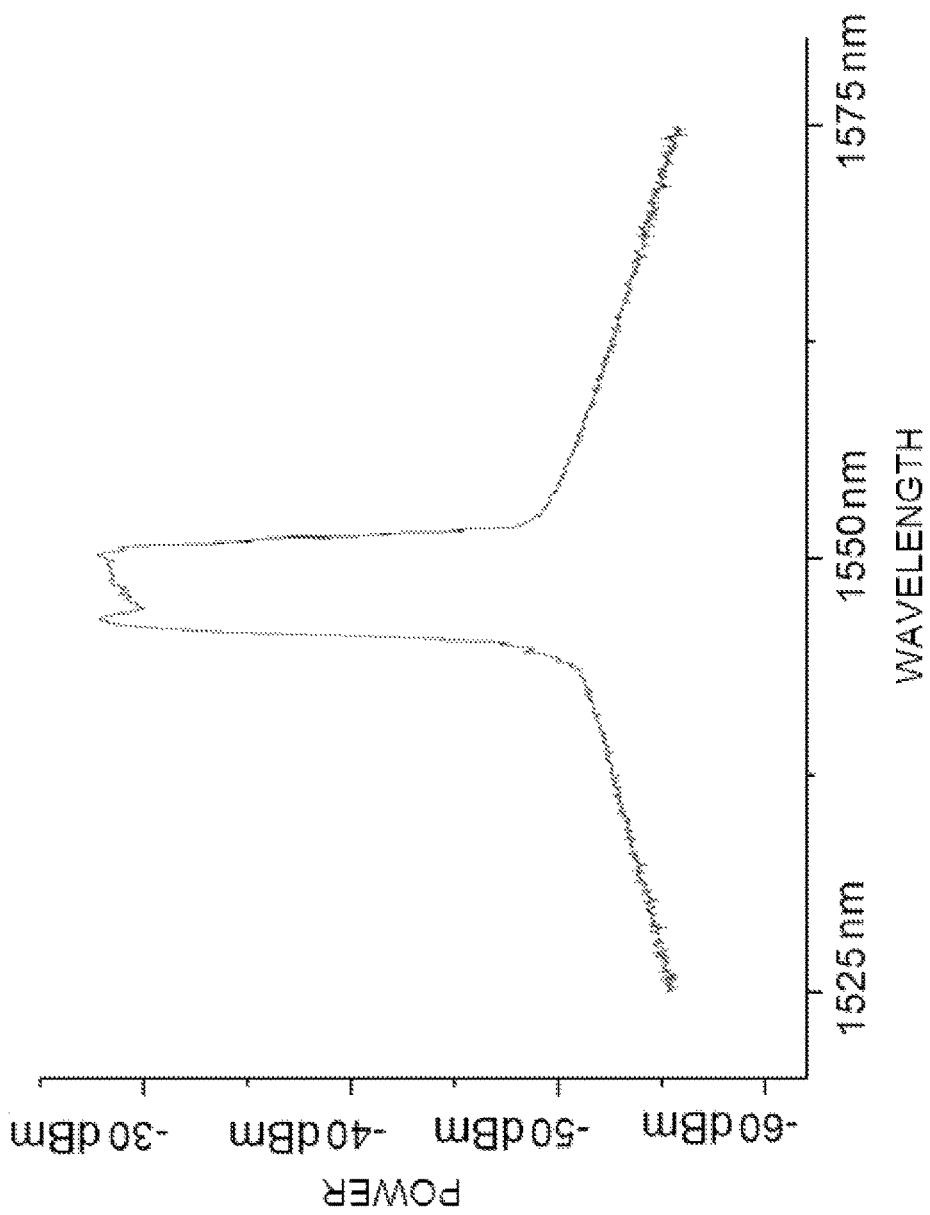
FIG. 8b shows the optical spectrum of the embodiment in FIG. 5 when operated according to the principle illustrated in FIG. 4.

When a sweeping rate of $f_S$=$f_R$=800 kHz is applied from an RF sweeping generator 7 to the VCO 4, the VCO is tuned from $f_m$ to $f_m$+$f_R$, to $f_m$+2$f_R$, to $f_m$+3$f_R$ and so on, in the 360-420 MHz range, i.e. in 800 kHz steps. The resulting RF signal from the VCO, 4, is amplified and injected into the mode-locking mechanism block (SOA 1, 2). This generates a narrow band laser output, as depicted in FIG. 3, having a linewidth of around 50 μm and a repetition rate of 800 kHz (as shown in FIG. 8a). When a sweeping rate of $f_S$=$f_R$+1 kHz=801 kHz is applied from 7 to the VCO 4, the VCO is tuned from $f_m$ to $f_m$+$f_R$+1 kHz, to $f_m$+2$f_R$+2 kHz, to $f_m$+3$f_R$+3 kHz and so on, in the 360-420 MHz range, in 801 kHz steps. The resulting RF signal from the VCO, 4, is injected into the SOA of the laser apparatus, therefore generating a comb laser output, as depicted in FIG. 4. Therefore a broadband swept laser optical output is obtained, (as shown in FIG. 8b), created by a comb, where each tooth has a linewidth of 50 pm and a repetition rate of 801 kHz.

Figure 9A:
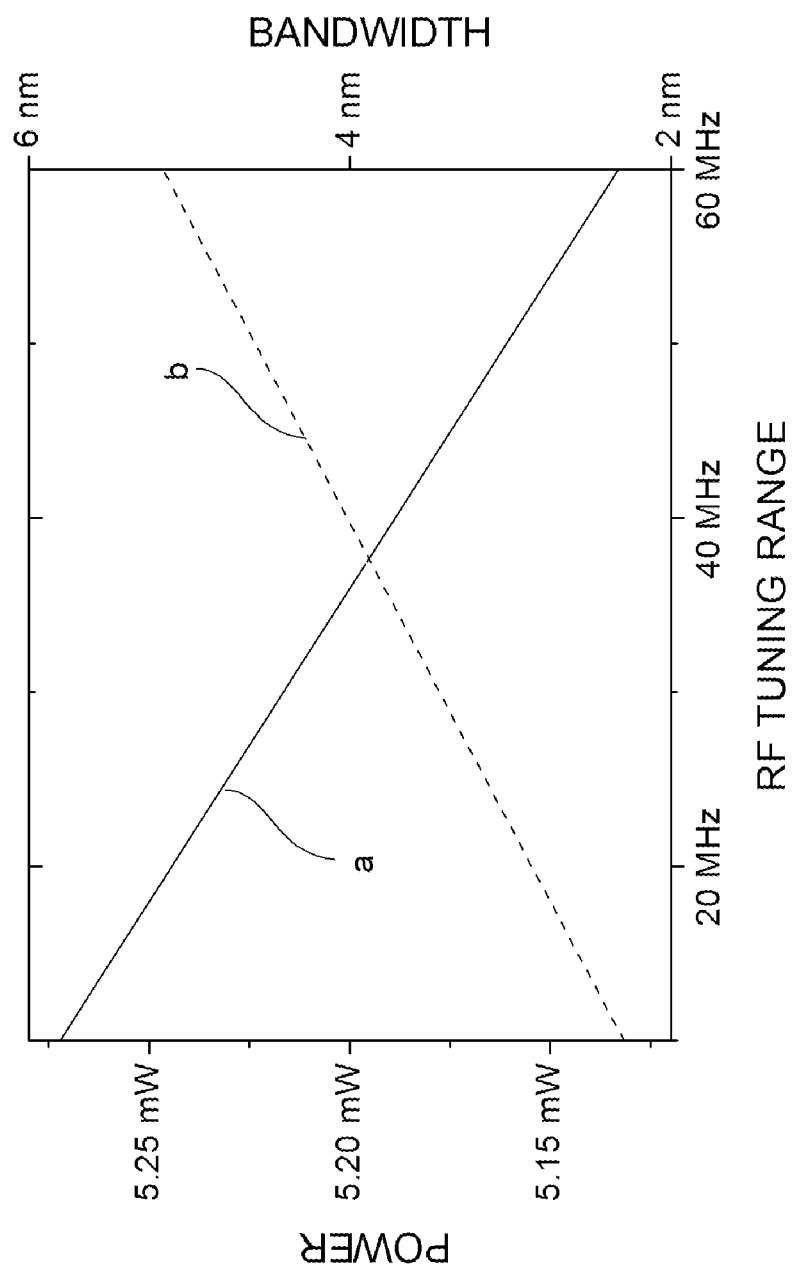
FIGS. 9a, 9b and 9c show the optical tuning bandwidth and the optical power for respectively three values of the RF sweeping bandwidth $\Delta f_S$=1, 2, 3 kHz.
Figure 9B:
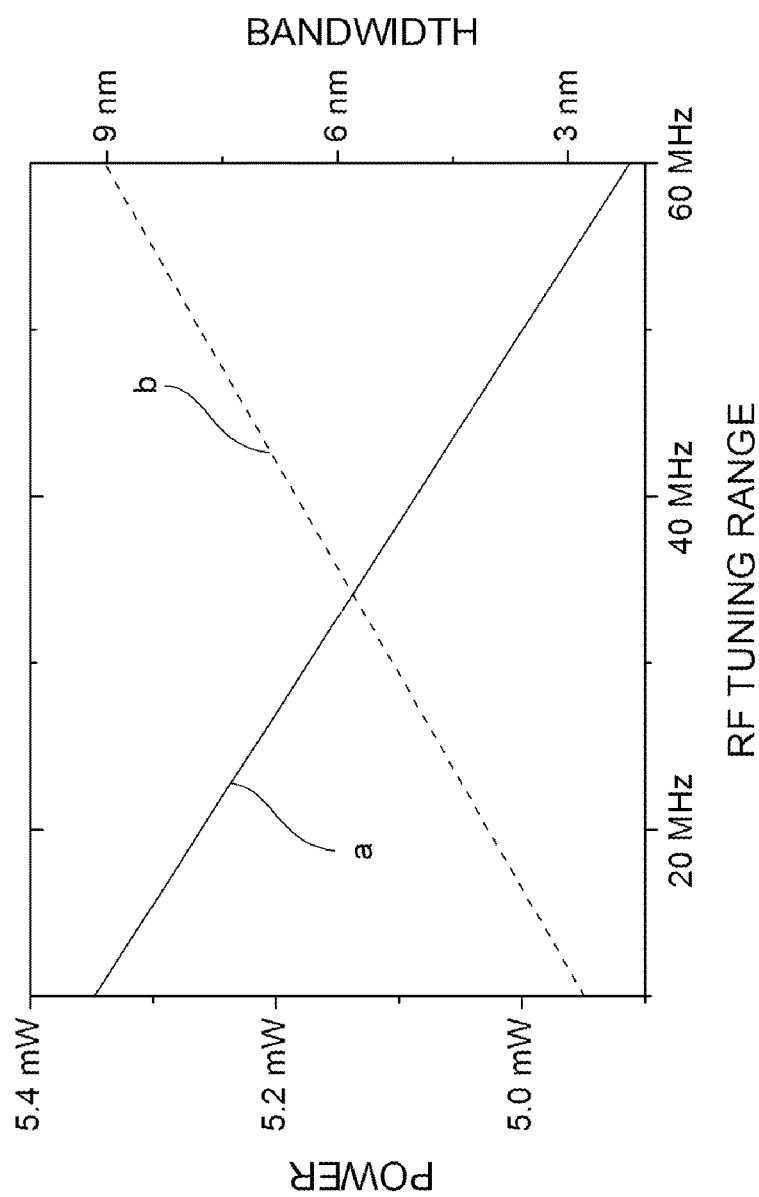
Figure 9C:
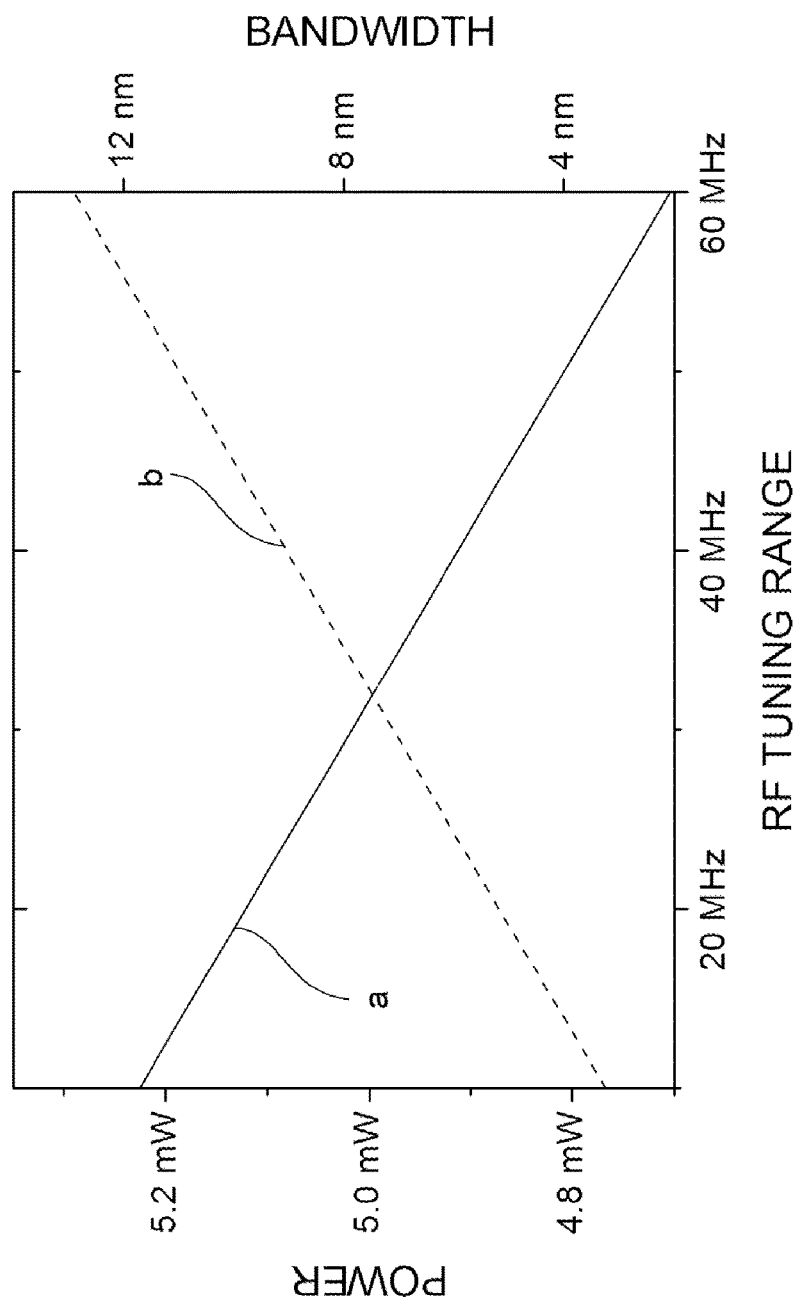

To shed more light into the operation of the akinetic swept laser according to the invention, the effect of detuning the RF from $f_R$, $\delta f$, on the optical bandwidth $\Delta\lambda$, expressed in nm, as a positive effect, and on the optical power, as a negative effect, is illustrated in FIG. 9a (1 kHz detuning), FIG. 9b (2 kHz detuning) and FIG. 9c (3 kHz detuning), where the graphs a represent the power versus RF tuning range, while graphs b represent the optical tuning bandwidth versus the same RF tuning range. As shown, the larger the detuning, $\delta f$, according to the invention, the larger the tuning optical bandwidth, $\Delta v$ (right vertical axis). However, the larger $\delta f$, the lower the optical power (left axis), so a trade-off needs to be established between power and tuning bandwidth.

In FIG. 5, a scanning delay line in transmission, as disclosed in Patent Document 6, (U.S. Pat. No. 7,417,741 B2), can be used to replace the dispersion compensating fibre, 3a. Such a configuration can be employed here not for scanning, but to allow dispersion.

FIG. 10 shows the embodiment of a large frequency deviation generator to deliver a wide tuning range RF signal to cover many mode-locking bands, as required by the akinetic tuning laser method, according to the invention. Because the tuning bandwidth of a commercial VCO is limited, two such VCOs, 11 and 12 are used. They emit at much larger frequency than that needed to drive the mode-locking mechanism block 1 and therefore exhibit a larger tuning bandwidth than a commercially available VCO designed for the central frequency $f_m$ needed. Their output signals are mixed together via a mixer 13. Via a low pass filter, 14, the signal oscillating at the sum of frequencies is attenuated and the signal oscillating at the difference of frequencies passes through to the output 16 to be delivered to the bias tee 80. The two VCOs need to be swept in antiphase. This is achieved by using an inverter 17 of the signal 18 from the generator 7. The generator 7 can deliver sinusoidal, triangle or saw tooth shape signals at a frequency multiple of $f_R$, for the example in FIG. 10, at 400 kHz. To adjust the optical frequency, the signals applied to the two VCOs are adjusted in amplitude and bias via controllers 20, 21, and 20' and 21' applied to amplifiers 22 and 22' respectively.

Combination of even lower central frequency VCOs can be used to obtain a larger frequency deviation, such as for example, VCO 11 (Mini-Circuits type ZH95-1790-S+) and VCO 12 (Mini-Circuits, type ZH95-1240-S+) to deliver at the 41 output an RF of 500 MHz $f_m$, deviated by 200 MHz $\Delta f_m$.

In FIG. 11, a quieter VCO generator 4 is disclosed. Let us say that the signal 71 from the sweeping generator 7 is a saw-tooth. During the fast transition of signal 71 from maximum to minimum, for any new period, the VCOs 11 and 12 are tuned extremely fast. During this short time, the VCOs 11 and 12 emit spurious signals. It is known that the mode-locking in the cavity requires a quiet, well defined signal. In order to eliminate spurious signals that can disturb the mode-locking, only the smooth useful ramp should be applied to the VCOs 11 and 12.

For further control of the sweeping and enhanced stability, the signal delivered to the output 16 during the turnaround time intervals of signal 71 is clamped using a synchronised switch, 23, according to the diagram shown in FIG. 11. In FIG. 11, a TTL signal, 81, from generator 7 is shaped to a pulse of equal duration with the turn-around of signal 71, in the shaper 35 and delayed in respect to the TTL signal in the delay circuit 32 and then applied to an RF switch, 23. As an example, this is being implemented using a Mini-Circuits Type ZX95-368+.

Second Example

Figure 12:
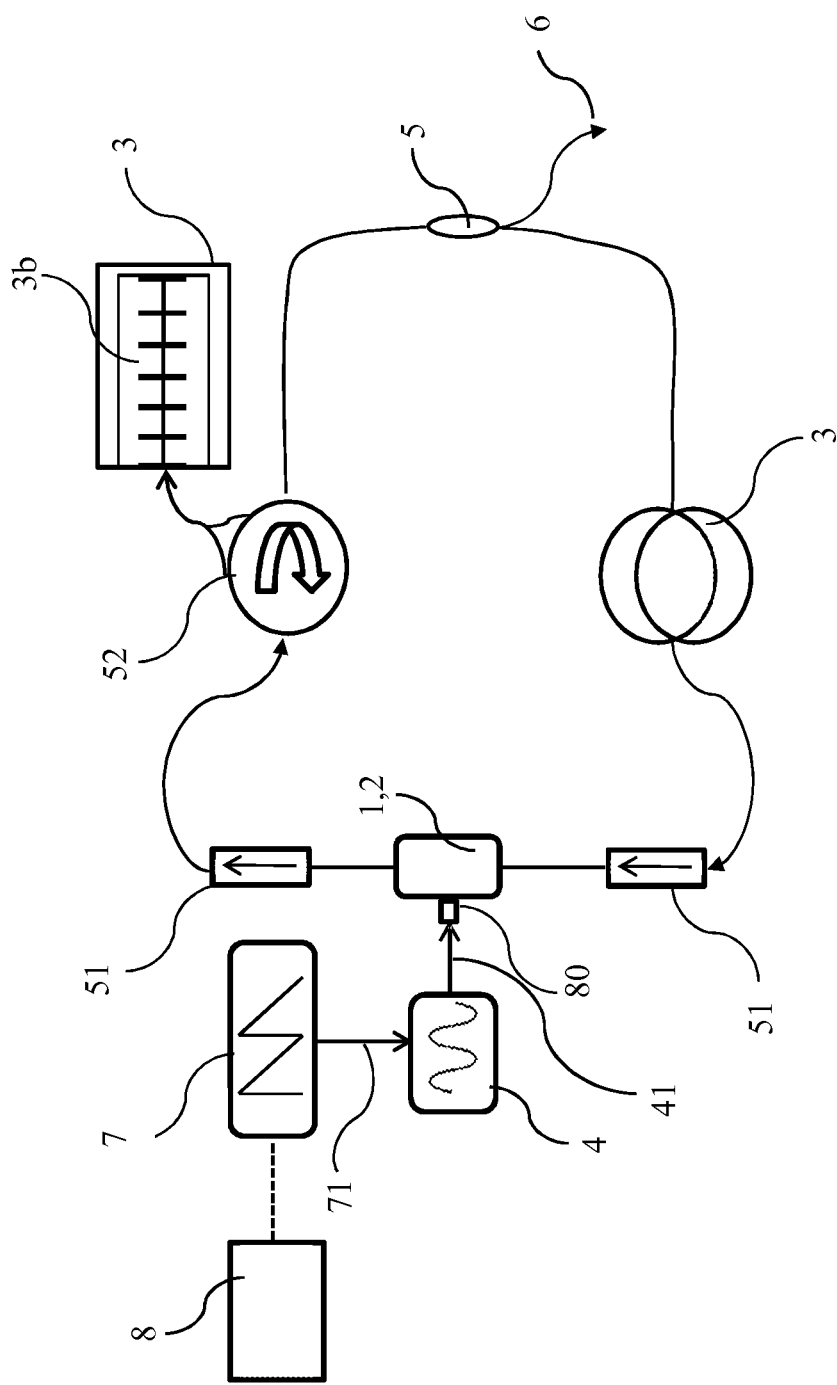
FIG. 12 shows an embodiment for a swept laser according to the invention, where the dispersion element uses a chirped fibre Bragg grating.

In the second example, the operation of the basic ring cavity swept laser, as shown in FIG. 12 will be illustrated with a different dispersion means. This comprises an assembly containing the following elements: an optical circulating device 52 and a chirped fibre Bragg grating (cFBG), 3b. According to FIG. 12, the embodiment uses a semiconductor optical amplifier (SOA) as gain medium 1, 2, modulated by a large frequency deviation VCO 4 driven by large frequency sweeping generator 7. A SOA, 1, 2, is delimited by two fiber optic isolators, 51, to ensure unidirectional lasing.

The RF signal 41 is applied to the SOA 1, 2 via a radio frequency input 80 (bias tee). A controller 8 is used to drive the sweeping generator 7. The controller 8 is instructed by three parameters: $f_R$, $\delta f$ and b.

As a particular example, a system according to FIG. 12 was assembled, operating at 1060 nm, using a SOA (QPhotonics-1050) with a maximum current 300 mA and a bandwidth larger than 100 nm. A cFBG, 3' (QPS Photronics, 36 nm bandwidth, central optical wavelength at 1060 nm, dispersion parameter 11 ps/nm) is used in reflection and single mode optical fiber 93 (SMF, type Hi1060, transmitting in an optical band around 1060 nm, 1 km length, chromatic dispersion −50 ps/nm·km). Optical isolation in the optical circulator 52 ensures unidirectional optical wave transmission in the system and therefore the isolators, 51, may not be needed.

The output optical emission is drawn out through splitter 5, a single mode coupler of 50/50, with 50% extracted out of the cavity through the optical channel 6.

By using a variable frequency RF signal generator, replacing large frequency deviation generator 4, the cavity resonance frequency, $f_R$ is found as 200 kHz. This corresponds to the inverse of the round trip in the ring, i.e. to:

$L/(c/n)=1/f_R=1/(200 \text{ kHz})$, so using $c=3\cdot10^8$ m/s and n=1.5, L=1000 m, where L represents the total optical path length in the cavity.

A saw-tooth sweeping signal of 5 V amplitude and 2.5 V bias, signal 71, is generated by an RF synthesizer, as large voltage sweeping generator 7 and applied to a large frequency deviation voltage controlled oscillator (VCO), type ZX95-368+, 4. The RF tuning range of the VCO is $\Delta f_m=60$ MHz (in a range from $f_{m,min}=360$ MHz for 0 V to $f_{m,max}=420$ MHz for 10 V).

When a sweeping rate of $f_S=f_R=200$ kHz as signal 71 is applied from large voltage sweeping generator 7 to the large frequency deviation VCO 4, this is tuned from $f_m$ to $f_m+f_R$, to $f_m+2f_R$, to $f_m+3f_R$ and so on, in the 360-420 MHz range, i.e. in 200 kHz steps. Similar results as above are obtained, with a linewidth of around 60 μm and a repetition rate of 200 kHz.

In FIG. 12, a scanning delay line in reflection, as disclosed in the Patent Document 7 (U.S. Pat. No. 7,061,622), can be used as dispersive means, 3, replacing the cFBG, 3b. Such a configuration can be employed here not for scanning, but to allow dispersion.

Figure 13:
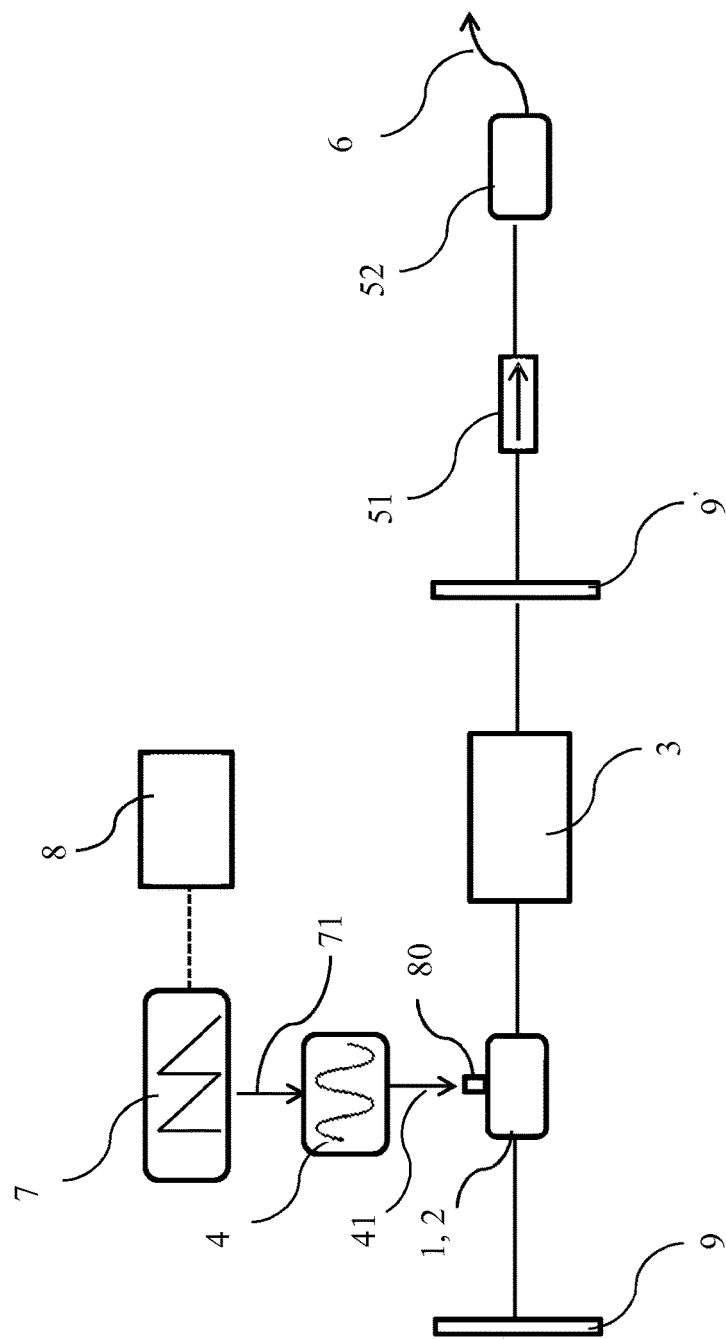
FIG. 13 shows another possibility of a dispersive laser configuration, equipped with a linear cavity.

FIG. 13 discloses an embodiment, in the second aspect of the akinetic swept laser, based on a linear laser cavity. The embodiment in FIG. 13 uses a semiconductor optical amplifier (SOA) as mode-locking mechanism block, 1, and gain medium, 2, identified as 1, 2. The linear cavity comprises dispersive means 3, a totally reflective mirror 9 and a partially reflective mirror 9', which transmits part of the total optical signal generated within the linear cavity. This signal is sent through an optical isolator 51 which ensures unidirectional lasing and denies any signal back reflections. An optical amplifier 52 amplifies the output from the linear cavity and generates an output optical signal 6.

As dispersive means, a dispersion compensating fibre, as 3a in FIG. 5, or a circulator with a cFBG, as 3b in FIG. 12 or a scanning delay line in transmission, as disclosed in the Patent Document 6 (U.S. Pat. No. 7,417,741 B2) can be used.

Figure 14:
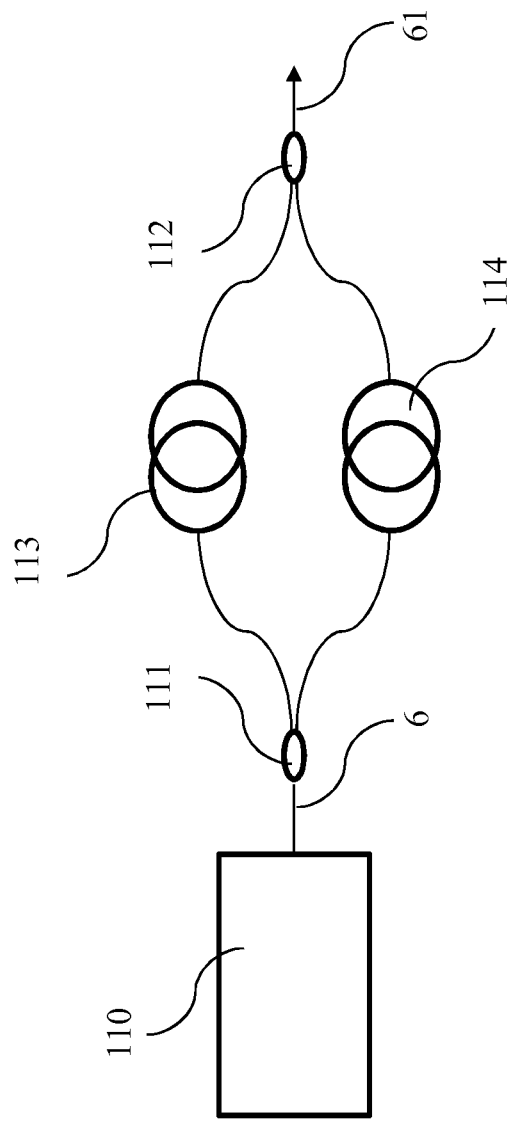
FIG. 14 shows a swept laser according to the invention equipped with buffering.

FIG. 14 discloses a configuration where buffering is applied to the akinetic swept laser 110. Using the circuit in FIG. 11, the emission is compressed within a fraction W of the round trip time, in $1/(W\cdot f_R)$. Let us say that W=2. In this case, with the example of $f_R=800$ kHz, buffering can be used to double the sweeping rate to 1600 kHz. A delay circuit, made from splitter 111 and splitter 112 and delay fibres 113 and 114 implement buffering according to the technology known in the art. The differential delay between fibres 113 and 114 is $1/(2f_R)$. 61 represents the output optical buffered signal that results after the optical output 6 travels through the buffering region.

Third Example

In the third example, the operation of an akinetic swept laser based on the present invention which utilizes length doubling of a dispersive medium is described.

Figure 15:
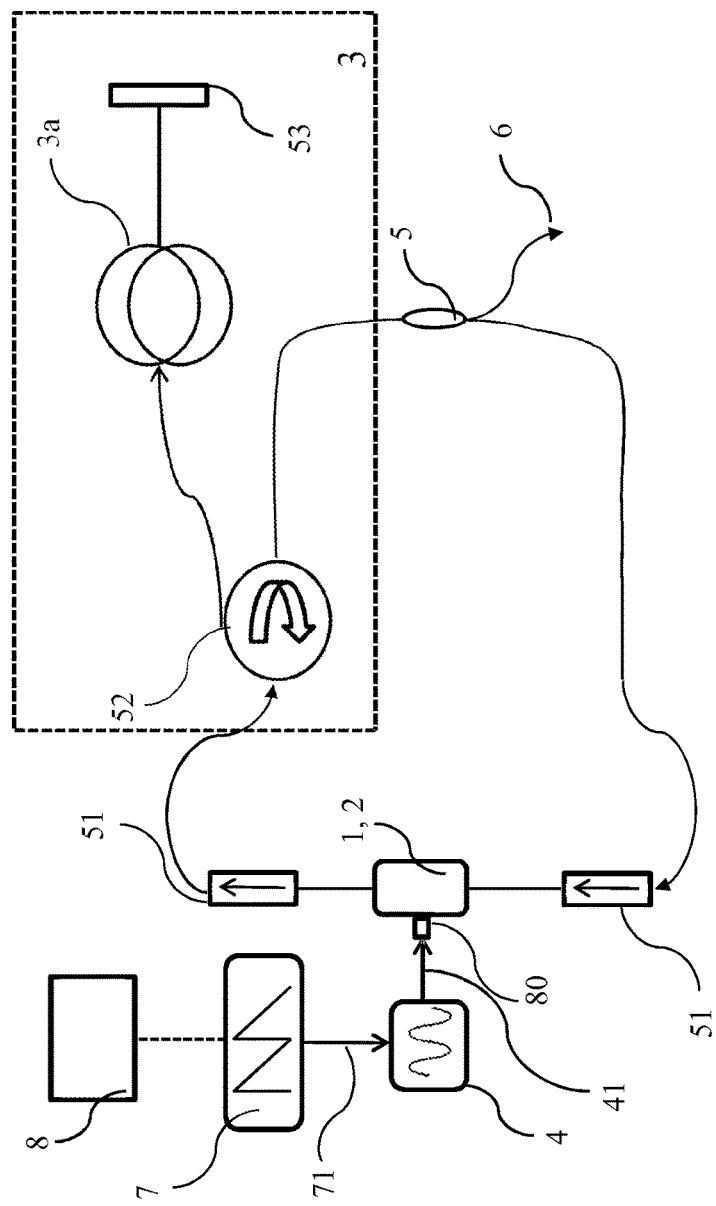
FIG. 15 shows experimental diagram of a swept laser according to the invention where a dispersion compensating fiber is used twice by using a Faraday rotating mirror.

FIG. 15 presents such an embodiment, where the dispersive means are doubled in effective length, for reduced cost and with the added advantage that polarization effects inside are cancelled. This embodiment uses as 1, 2 (amplifier and mode-locking mechanism block), a semiconductor optical amplifier, delimited by two fiber optic isolators 51, which ensure unidirectional lasing. The RF signal 41 is generated by driving radio frequency generator according to FIG. 10, a VCO 4, whose input signal 71 is delivered by a saw-tooth sweeping generator, 7. The controller 8 is used to drive the sweeping generator 7, by instructing 7 three parameters: $f_R$, $\delta f$ and b.

The RF signal 41 is applied to the SOA 1, 2 via a radio frequency input 80 (bias tee). The dispersing means 3 consists in a circulator, 52, that directs light through a DCF length 3a, terminated on a broadband Faraday rotating mirror, 53). The purpose of 53 is to cancel the polarization effects inside the laser cavity and to double the length of the cavity. Such a configuration is of low cost due to the need of half of DCF length to obtain the same dispersion. The output optical emission is drawn out through splitter 5, and then amplified by a booster, 6.

To implement practically the embodiment in FIG. 15, we have used as 1, 2 (amplifier and mode-locking mechanism block), a semiconductor optical amplifier (SOA), model SOA-L-C-14-FCA (CIP 1, from BT), operating at 1550 nm, maximum current 500 mA and 3 dB bandwidth larger than 50 nm. The RF signal 41 is generated by driving radio frequency generator, a VCO 4 Mini-Circuits type ZX-928CA+, whose input signal 71 is delivered by a saw-tooth generator, 7, Agilent type 81160A. A 110 m length $L_{DCF}$ of Draka Elite DDU1171023 DCF as 3a is used, with an anomalous dispersion parameter −140 ps/nm·km at 1550 nm. The Faraday rotating mirror, 53, is supplied by AFW Technologies, with 60 nm bandwidth at 1550 nm. The combination of the negative dispersion due to the equivalent DCF of length $L_{DCF}=200$ m with the positive dispersion $D_{SMF}=15$ ps/nm·km at 1550 nm, due to the single mode fibre of length $L_{SMF}=35$ m, determines a net negative dispersion of: $L_{DCF}D_{DCF}+L_{SMF}D_{SMF}=-30$ ps/nm. The splitter 5 is a single mode coupler of 50/50, and the booster 6 is SOA-L-C-14-FCA (CIP 1 from BT).

Figure 16:
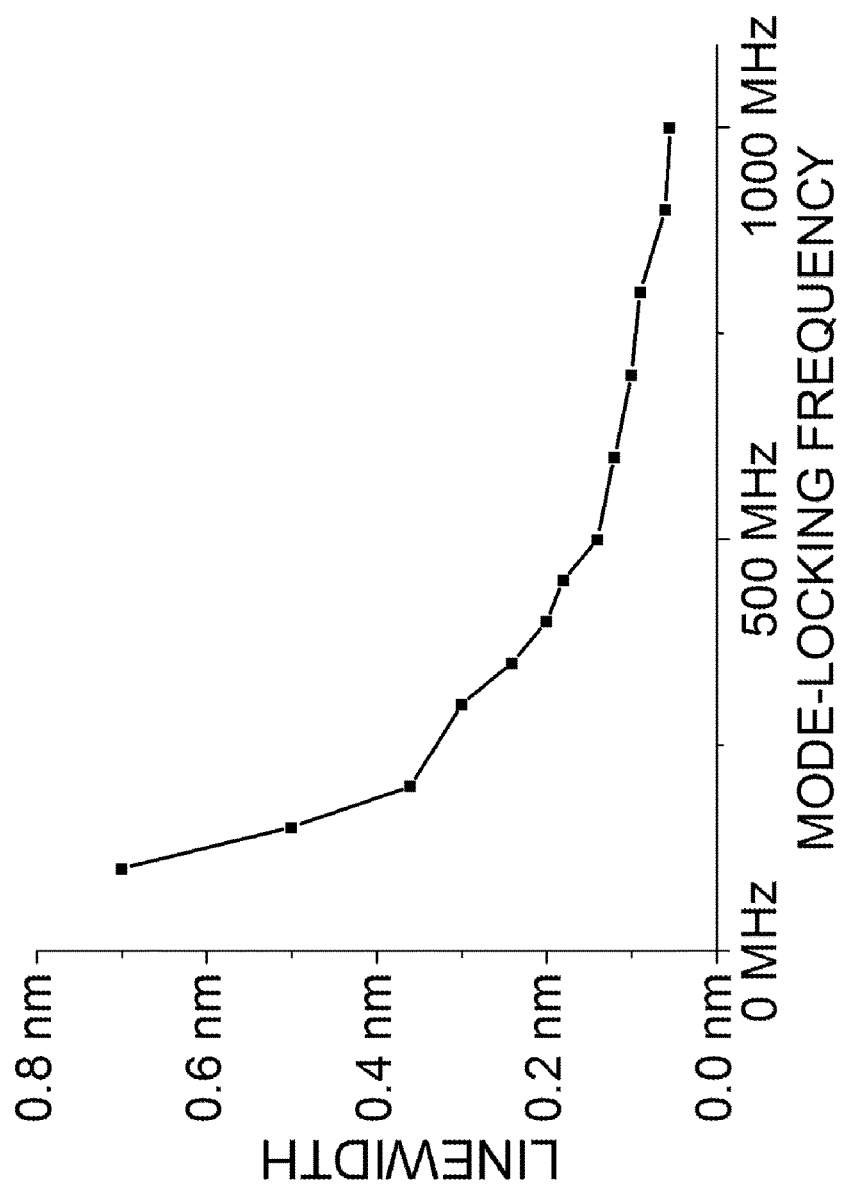
FIG. 16 shows linewidth versus mode-locking frequency in the static regime for the embodiment in FIG. 15.

FIG. 16 represents the optical linewidth measured for excitation of frequency $f_m$ in a 1 GHz range. A value of 60 pm is achieved for mode-locking frequencies above 800 MHz. This value matches the resolution of the optical spectrum analyser used (Agilent 86145B), of 60 pm, meaning that the linewidth was better than that measured.

Figure 17:
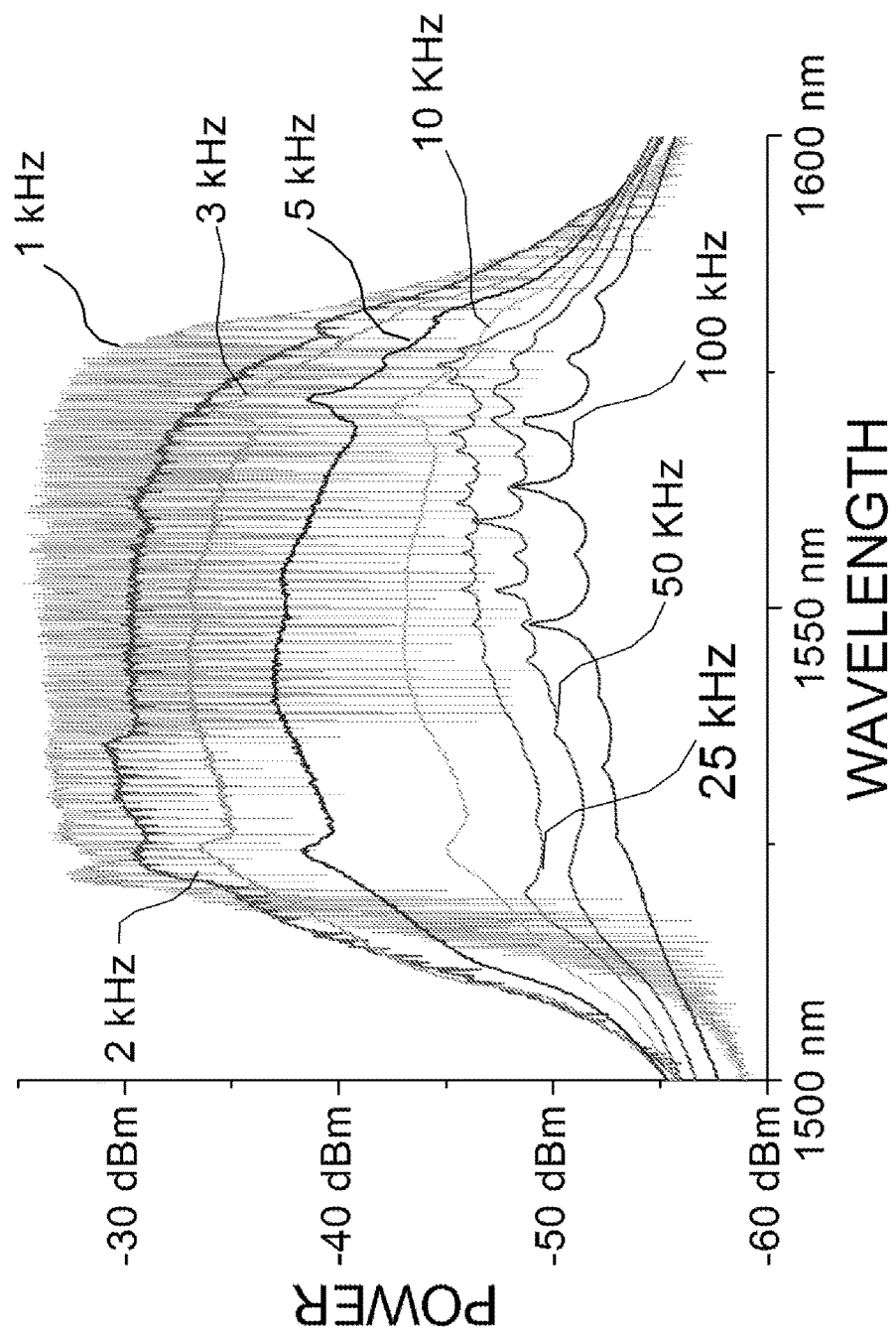
FIG. 17 shows dynamic swept optical output using the $1^{st}$ mode-locking mechanism only for the embodiment in FIG. 15.

By changing the dc value of the signal 71 delivered by the large voltage generator 7, the central frequency $f_m$ of the large frequency deviation generator 4 can be tuned statically. Sweeping rates achieved are no more than a few tens of kHz that exhibit sufficient output optical power, as represented in FIG. 17.

The cavity length determines $f_R$=782 kHz and the VCO 4 is driven initially with a signal 71 of frequency $f_m$ in the range 360-420 MHz. When the signal applied to 4, 71, is swept at a sweeping rate of $f_S$=$f_R$, then the VCO 4 spectrum consists in a comb of frequencies $f_m \pm f_R$, $f_m \pm 2f_R$, $f_m \pm 3f_R$ and so on, i.e. in 782 kHz steps. This generates a narrow band laser output, having a linewidth $\delta\lambda$ and $f_R$ repetition rate. If $f_S$=$f_R$, no tuning is noticed again, as documented in FIG. 8a for the embodiment in FIG. 5. To perform tuning in the spirit of the method according to invention, sweeping needs to be performed at a detuned rate from $f_R$. Therefore, $f_S$=$f_R \pm \delta f_R$, in which case the large frequency deviation generator 4 is tuned with a comb spectrum consisting in $f_m$, $f_m + f_R \pm \delta f_R$, $f_m + 2f_R \pm 2\delta f_R$, $f_m + 3f_R \pm 3\delta f_R$ and so on.

Figure 18:
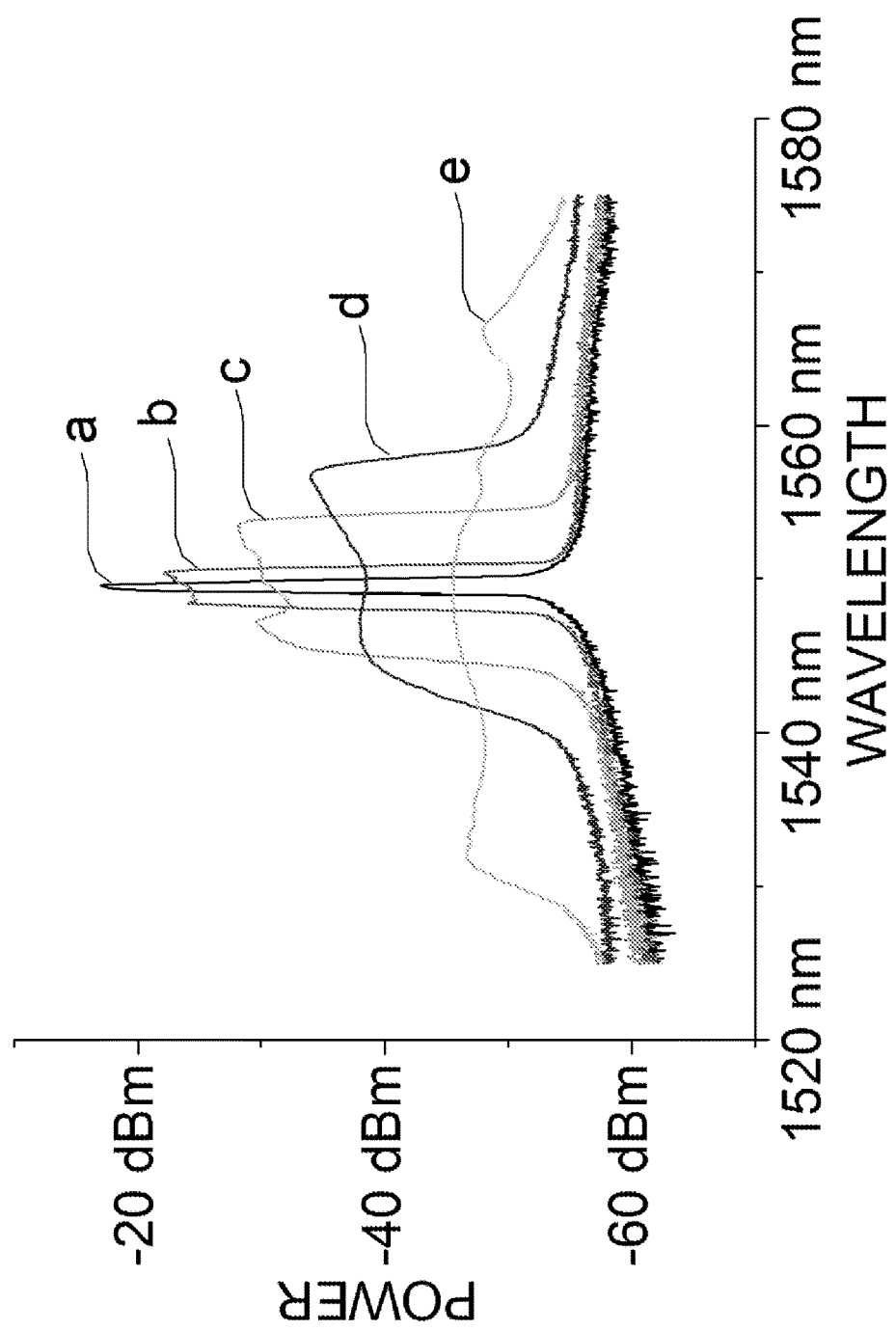
FIG. 18 shows an example of the optical spectrum of the embodiment in FIG. 15, for 5 different detuning $\delta f_R$ values.

FIG. 18 displays the spectrum obtained in dynamic regime, measured for several values of detuning, $\delta f$. Each graph corresponds to a certain repetition rate due to the detuning from $f_R$, 18a, 18b, 18c, 18d and 18e corresponding to $f_S$=781 kHz, 782 kHz, 783 kHz, 787 kHz and 796 KHz, respectively. The optical output 6 shows a decrease in power from 18a to 18e.

When the frequency of signal 71 driving the large frequency deviation generator 4 is swept at a rate $f_S$=$f_R$=782 kHz a narrow laser optical emission results (graph 18a in FIG. 18), in agreement with the expected behavior shown in FIG. 3. For a sweeping rate of $f_S$=$f_R$+1=783 kHz, the VCO 4 is tuned from $f_m$ to $f_m + f_R + 1$ kHz, to $f_m + 2f_R + 2$ kHz, to $f_m + 3f_R + 3$ kHz and so on, in the 880-940 MHz frequency range, in 783 kHz steps. The optical spectrum of the signal at the booster 6 output has a linewidth of 60 pm and a repetition rate of 783 kHz. For a sweeping rate of $f_S$=$f_R$+5=787 kHz, the large frequency deviation generator 4 is tuned from $f_m$ to $f_m + f_R + 5$ kHz, then to $f_m + 2f_R + 10$ kHz, to $f_m + 3f_R + 15$ kHz and so on, in the 880-940 MHz range, in 787 kHz steps. The emitted spectrum consists in a comb tooth having a linewidth of 60 pm and a repetition rate of 787 kHz. The same reasoning can be applied to each value of $\delta f_R$.

Figure 19:
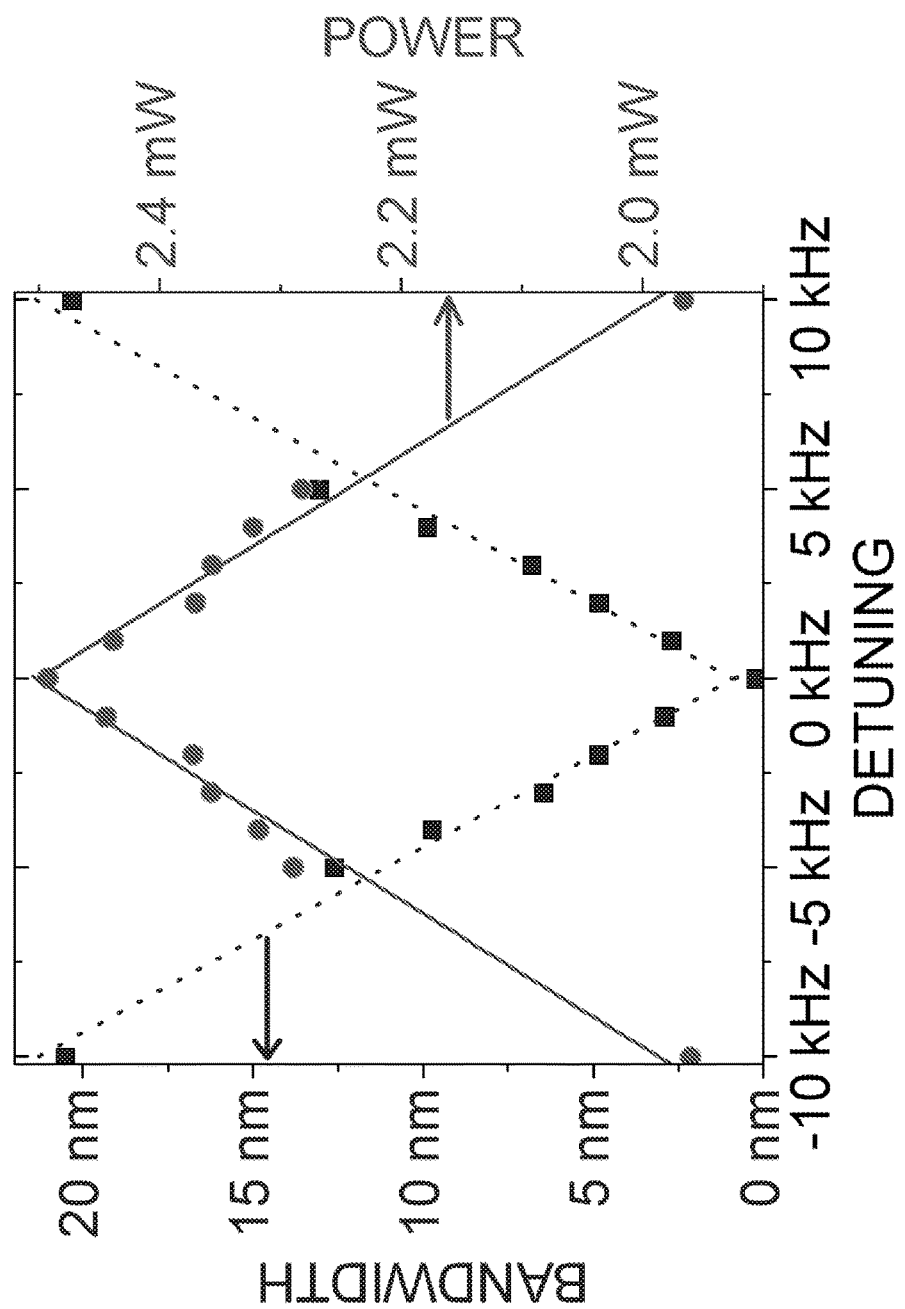
FIG. 19 shows the tuning bandwidth (dotted line) and output power versus detuning (solid line) for the embodiment in FIG. 15.

FIG. 19 presents the variation of power and optical tuning bandwidth with detuning, for the embodiment in FIG. 15.

Figure 20:
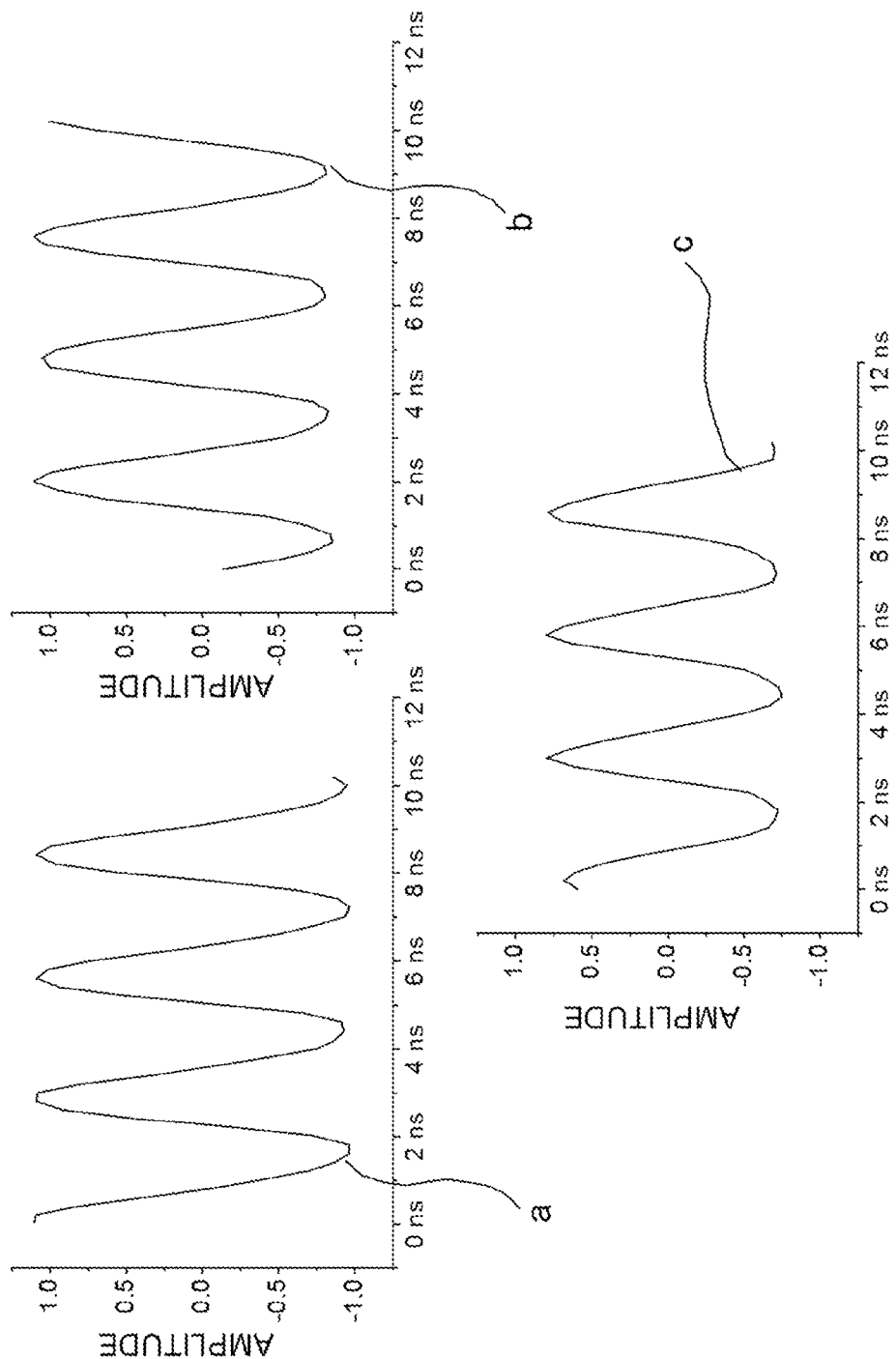
FIG. 20 shows mode locked pulses measured for 1 kHz, 5 kHz, 10 KHz and 15 kHz detuning, for the embodiment in FIG. 15.

In FIG. 20 the temporal output signal 6 measured for several values of detuning, 20a, 20b and 20c, corresponding to 1 kHz, 5 kHz and 10 kHz, respectively, is presented. There is no decrease in power until 10 kHz detuning. This shows the mode locked pulses and illustrate a slow decay in the mode-locking with detuning.

Without any optical amplification, the output power of the source is 2.3 mW. Using the SOA booster, 6, driven at 300 mA, an output power of 12.8 mW is measured. A trade-off is established between output power and percentage of amplified spontaneous emission.

For the mode-locking frequency $f_{m0}$ of 920.4 MHz, swept at $f_S$=792 KHz, a laser output optical bandwidth $\Delta\lambda$ of 16 nm, as shown in FIG. 18, graph d is obtained. While it is possible to tune the whole tuning bandwidth by ±30 nm by modifying the bias voltage applied to the VCO 4, it is not possible to achieve the same tuning bandwidth dynamically. This is due to the limited VCO 4 tuning bandwidth $\Delta F$ of 60 MHz for a swing of maximum allowed of 10 $V_{pp}$ ramp applied to its input. Let us say we are required to have a bandwidth of 60 nm, this means 60 nm/165 nm~4, shows that we would need a VCO with 4 times larger frequency swing to achieve the available tuning bandwidth of 30 nm. This demonstrates the need for large frequency generators, 4, implemented using configurations in FIG. 10 or FIG. 11.

Figure 21:
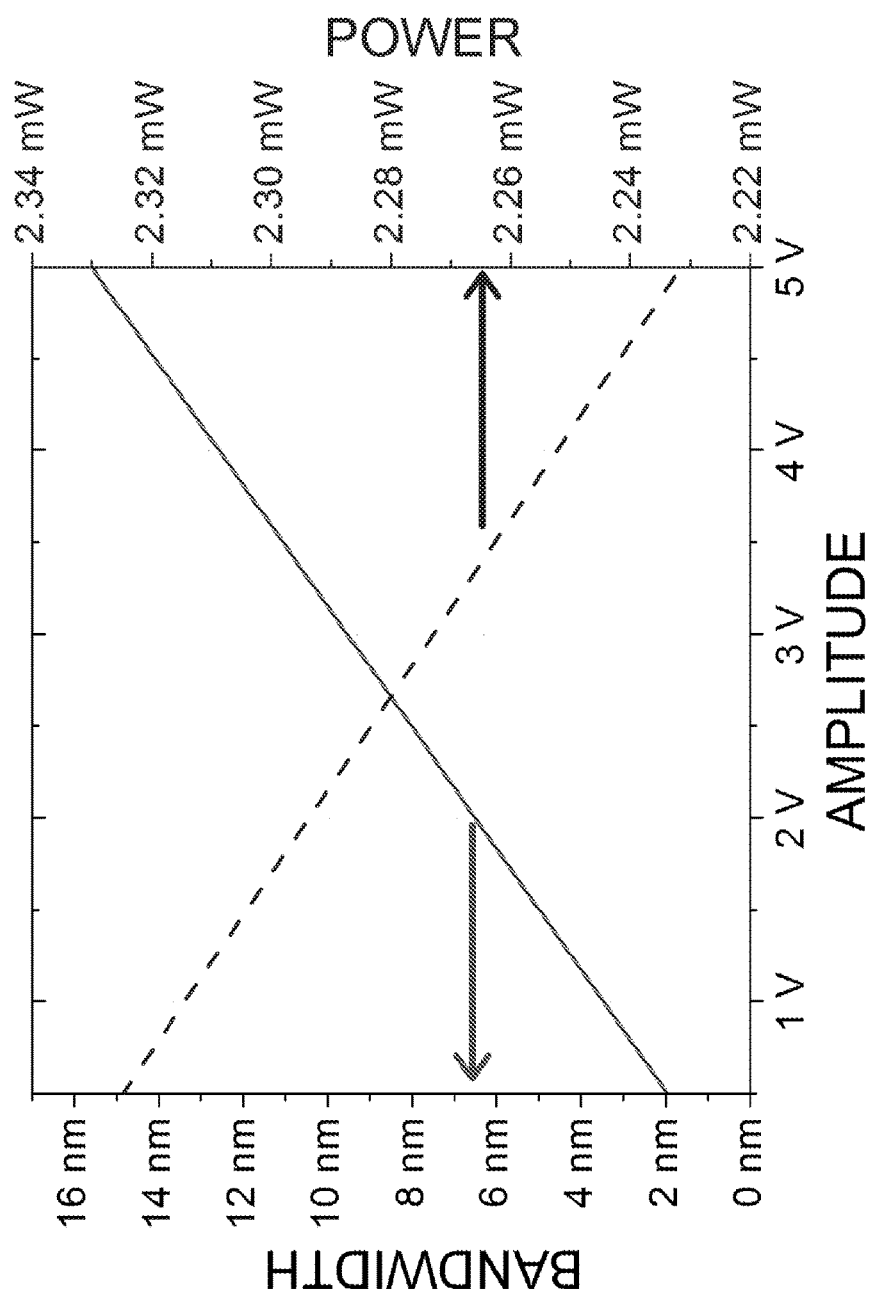
FIG. 21 shows the output power (dashed line) and tuning bandwidth (solid line) versus the ramp amplitude applied to the input for a detuning of 5 kHz.
Figure 22:
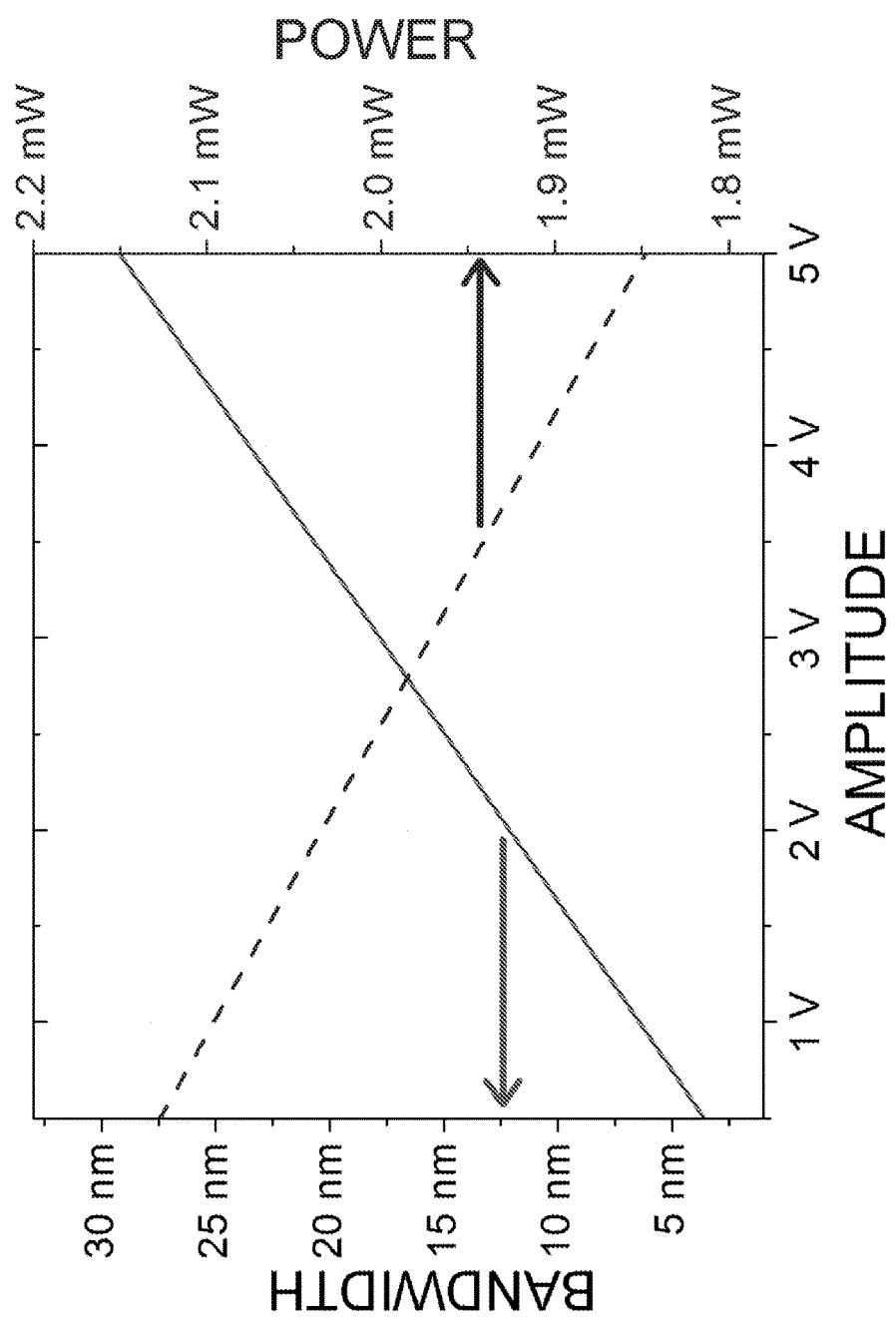
FIG. 22 shows the output power (dashed line) and tuning bandwidth (solid line) versus the ramp amplitude applied to the input for a detuning of 10 kHz.

FIG. 21 represents the dependence of the optical output power delivered by booster 6 and optical tuning bandwidth, $\Delta\lambda$, on the RF tuning range, for a values of detuning of $\delta f_{R1}$=5 kHz. FIG. 22 represents the dependence of the optical output power delivered by the booster 6 and optical tuning bandwidth, $\Delta\lambda$, on the RF tuning range, for a value of detuning of $\delta f_{R2}$=2·$\delta f_{R1}$=10 kHz.

For the presented case, the following elements of the equation (4) are constant: $f_R$, $C_m$ and $\delta\lambda$. This means that the output bandwidth measured at half of the previous detuning, of 5 kHz for a specific value of $\Delta f_m$, will give half of the optical bandwidth. For example, for a 2.5 Vpp signal driving the VCO 4, corresponding to $\Delta F$=20 MHz, a $\Delta\lambda$ value of 7.86 nm is measured for $\delta f_R$=5 kHz, and respectively 15.24 nm at 10 kHz. In the prior art, the RF frequency 41 of the large deviation frequency generator 4 is tuned within one locking band. In the spirit of the invention, the VCO 4 is tuned over many such locking bands, separated by $f_R$.

Let us consider equation (4), if for $f_R$ we have a value of $\Delta\lambda$, then at $Nf_R$, $\Delta\lambda$=$\Delta\lambda/N$. Let us consider the following example: 3 Vpp signal 71 driving the VCO 4, a 15.75 nm $\Delta\lambda$ value of the optical output 6 is measured for $\delta f_R$=10 kHz detuning from $f_R$. Let us now consider $\delta fR$=10 kHz detuning, modulating the VCO 4 at sweeping rates of 2 $f_R$ (1.564 MHz), 3 $f_R$ (2.346 MHz), 4 $f_R$ (3.128 MHz) and 5 $f_R$ (3.910 MHz). The optical tuning bandwidth $\Delta\lambda$ of the signal at the output of the booster 6 is measured as 7.9 nm, 5.5 nm, 4.2 nm and, respectively, 3.2 nm. The proportional reduction in the tuning bandwidth by N is accompanied by insignificant power variation.

The maximum deviation in frequency is 782 kHz, then at a $f_s$ sweep rate, the RF spectrum is made from a comb of frequencies distanced by multiples of $f_s$ around the carrier at $f_m$. The number of resolved frequency points within the spectrum, b, is given by the maximum frequency deviation, $\Delta f_m$, divided by $f_S$. $\Delta f_m$ depends on the swing of the signal 71 delivered by the large voltage generator 7 to the input of 4. If $f_S$=1 kHz, maximum achievable number of resolved point b=782. When driving the laser at a rate $f_R$, the only way to maintain a large number of resolved frequency points is by jumping the optical frequency of the swept source from one tuning band to the next, in steps of $f_R$. This means that a deviation of frequency as high as $b \cdot f_R$=782·782=611.52 MHz would be needed.

Figure 23:
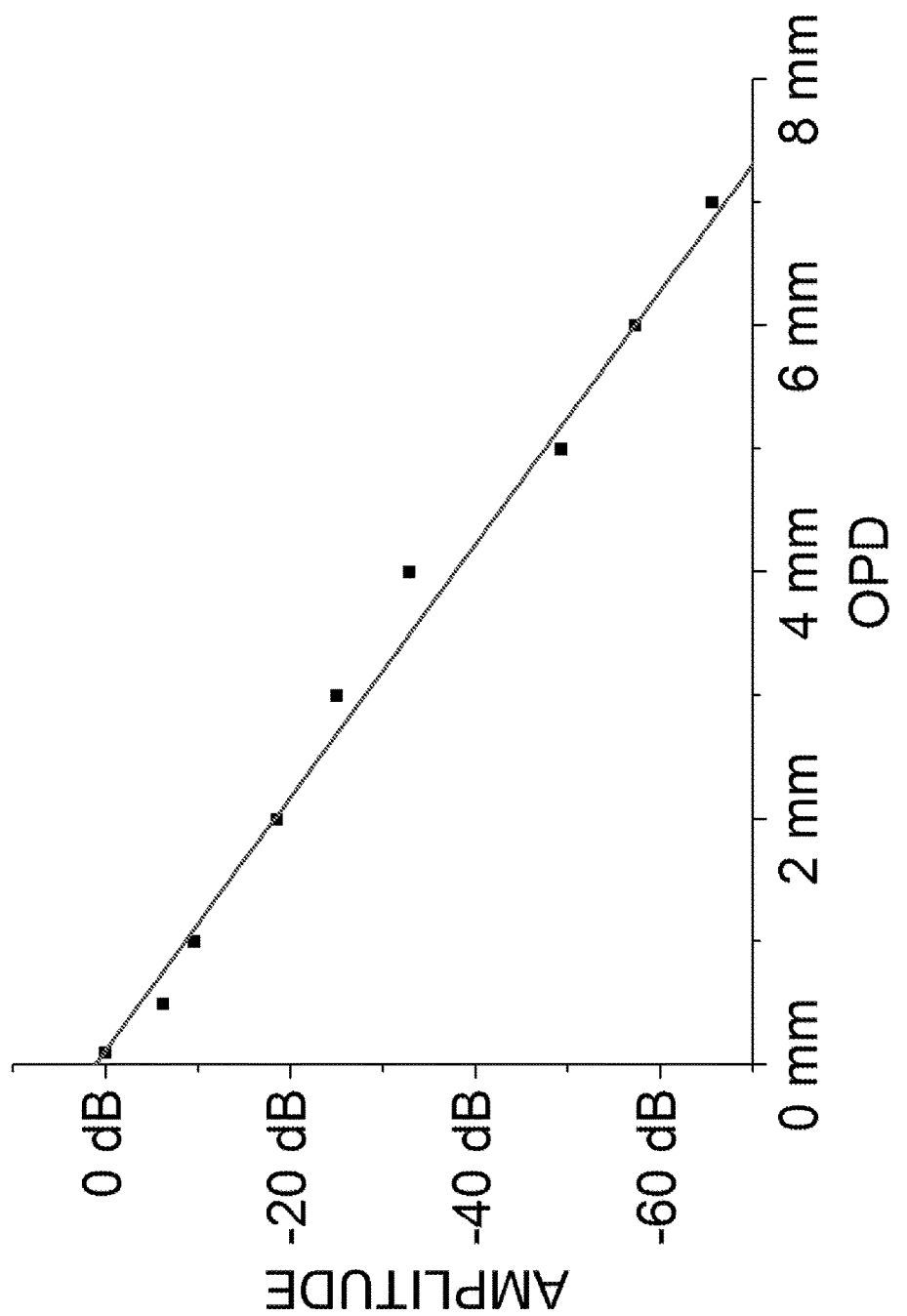
FIG. 23 shows the decay of modulation intensity with increasing optical path difference (OPD) in a measuring interferometer.

The curve shown in FIG. 23 can be used to infer the dynamic linewidth. The akinetic swept source in FIG. 15 is connected to a Mach-Zender interferometer and then FFT of the photodetected signal is evaluated for various values of the OPD in the interferometer. The narrower the dynamic linewidth, the smaller is the decay of the amplitude of the FFT with OPD. The swept laser is operated at 787 kHz repetition rate. Considering a Gaussian shape of the tuning spectrum, the dynamic linewidth is calculated as $\delta\lambda$=$\lambda^2$/4·$OPD_{6dB}$=1550·1550·nm²/4/750000 nm=0.8 nm. The sensitivity is calculated as 20·log($A_{OPD}/A_{noise}$), where $A_{OPD}$ represents the corresponding FFT peak amplitude value for the chosen OPD, while Anoise is the amplitude of the noise floor measured outside the FFT peak. A sensitivity of approximately 92 dB was measured.

Figure 24:
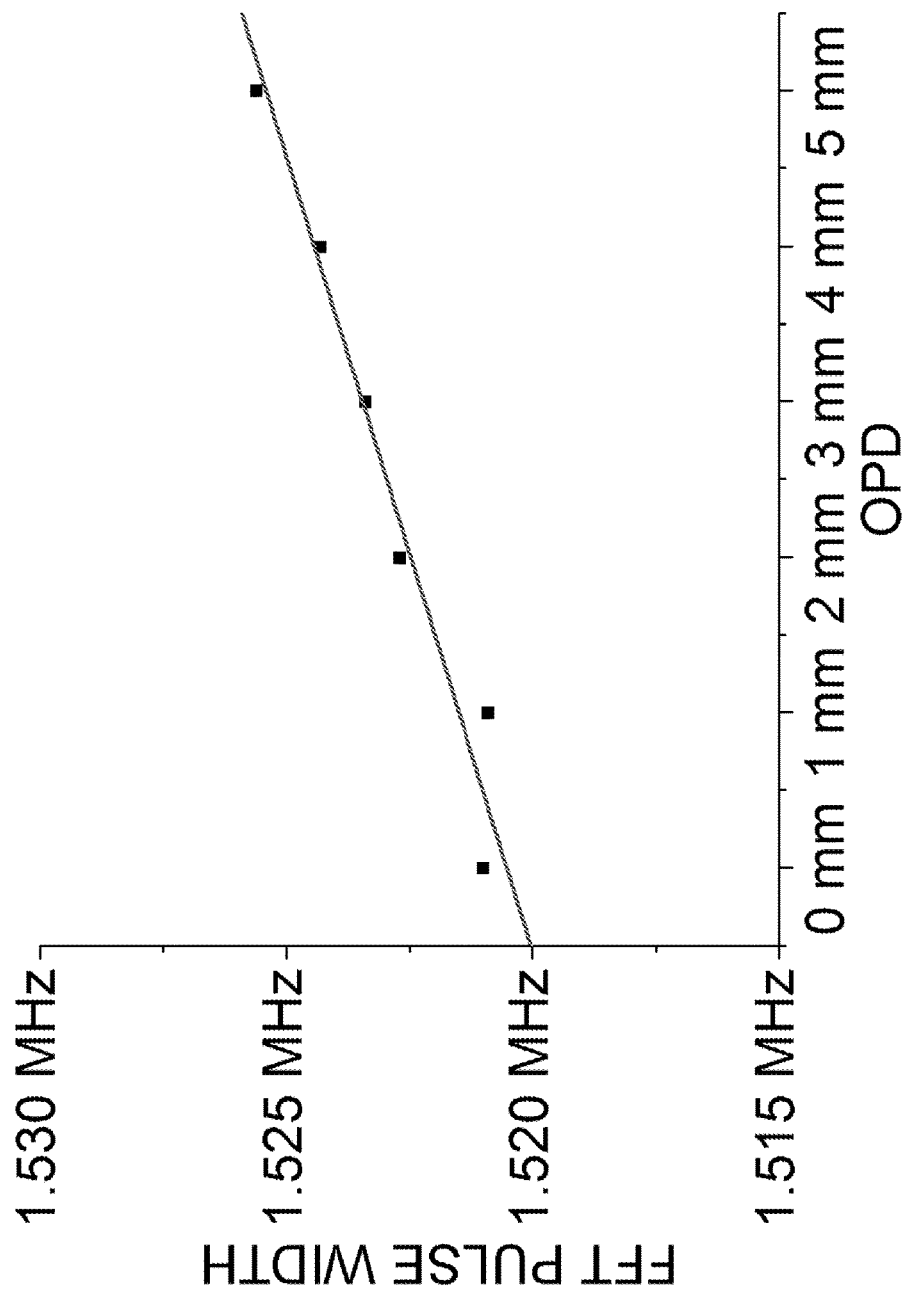
FIG. 24 shows the enlargement of the A-scan pulse versus OPD.

FIG. 24 depicts the A-peak width pulse width of the point spread function pulses obtained by operating the akinetic swept laser at a 787 kHz repetition rate, connected to the same Mach-Zender inteferometer, measured at several OPD values. The A-peak width shows insignificant variation, of only 0.4% at 5 mm OPD. This demonstrates that the tuning is almost linear in optical frequency.

The foregoing disclosure has been presented for the sake of illustration and description only. As such, it is not intended to be exhaustive or to limit the invention to the precise form disclosed.

The person skilled in the art should realise that without departing from the scope of the invention, modulation of nonlinearities in the cavity can be achieved by using a modulator, as mode-locking mechanism block 1, separated from the optical amplifier, 2, as detailed in FIG. 2.

Here the optical amplifier is shown using optical isolators to reduce feedback in the active medium. The person skilled in the art should be aware that other means of isolation exists, such as using circulators, or configurations may be devised that tolerate light traveling both ways, in which case no isolator is used.

The succession of elements in the laser cavity is not a feature of the invention and any other arrangement can equally be considered in the spirit of the invention.

Other modifications and alterations may be used in the design and manufacture of the swept laser of the present invention and in the application of the methods disclosed without departing from the spirit and scope of the accompanying claims.

The invention claimed is:

1. Method for akinetic tuning the laser emission of a dispersive cavity laser with a roundtrip time $1/f_R$ where $f_R$ is the resonant frequency of the cavity, and equipped with a mode-locking mechanism block, where driving the mode-locking mechanism block, by a voltage controlled oscillator, at a frequency $f_m$, in a RF tuning bandwidth centred on N multiples of the $f_R$, mode locks the laser within a mode-locking band having a bandwidth $\delta fm$ by sweeping the frequency $f_m$ by a sweeping generator that applies a sweeping signal at a rate $f_S$ to the voltage controlled oscillator, where the rate fs is slightly detuned by a non-zero frequency detuning $\delta f$ from multiples M of $f_R$; the frequency $f_m$ is swept over an RF tuning bandwidth, $\Delta f_m$ which is much larger than $f_R$ and includes B mode-locking bands, and wherein by sweeping the frequency $f_m$ over the RF tuning bandwidth $\Delta f_m$ at the rate fs, the optical frequency of the laser is tuned over an optical tuning bandwidth.

2. Method for akinetic tuning the laser emission of a dispersive cavity laser according to claim 1, where N is larger than 100 and M is in the range of 1 to 100, where M determines a sweeping rate of the output laser signal of $Mf_R$.

* * * * *